United States Patent
Leblanc et al.

(10) Patent No.: US 7,881,689 B2
(45) Date of Patent: *Feb. 1, 2011

(54) VEHICLE RADAR SENSOR ASSEMBLY

(75) Inventors: Stephen P. Leblanc, Stratham, NH (US); Richard Paul Donovan, Windham, NH (US); Joseph S. Pleva, Londonderry, NH (US)

(73) Assignee: Valeo Radar Systems, Inc., Hudson, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/363,949

(22) Filed: Feb. 2, 2009

(65) Prior Publication Data

US 2009/0135043 A1 May 28, 2009

Related U.S. Application Data

(63) Continuation of application No. 11/323,816, filed on Dec. 30, 2005, now Pat. No. 7,603,097, which is a continuation-in-part of application No. 11/027,523, filed on Dec. 30, 2004, now Pat. No. 7,680,464.

(51) Int. Cl.
*H04B 1/00* (2006.01)
*G01S 13/00* (2006.01)
*H05K 9/00* (2006.01)

(52) U.S. Cl. .................. 455/300; 455/301; 455/90.3; 342/70; 361/816; 361/818

(58) Field of Classification Search .............. 455/300, 455/301, 90.3, 575.5, 575.8; 342/70, 872; 361/816, 818
See application file for complete search history.

(56) References Cited

U.S. PATENT DOCUMENTS 2,540,839 A 7/1940 Southworth (Continued)

FOREIGN PATENT DOCUMENTS

EP 1 233 471 A2 8/2002

(Continued)

OTHER PUBLICATIONS

European Office Action dated Jul. 7, 2010 for Pat. Appl. No. 06 127 324.9.

(Continued)

*Primary Examiner*—Duc M Nguyen
(74) *Attorney, Agent, or Firm*—Daly, Crowley, Mofford & Durkee, LLP

(57) ABSTRACT

A radar electronics module includes a support structure having a first surface having a plurality of recesses with a transmitter circuit board and a receiver circuit board disposed thereon. The transmitter and receiver circuit boards are disposed over the first surface of the supports structure such that transmitter and receive circuits are disposed in cavities on the support structure. The radar electronics module further includes a digital/power supply circuit printed wiring board (PWB) disposed on a second surface of the support structure and a connector disposed on the support structure. The connector is disposed in such a way that it provides electrical connections for at least one of power signals, analog signals or digital signals between at least two of the digital/power supply PWB, the transmitter circuit board and the receiver circuit board.

20 Claims, 13 Drawing Sheets

U.S. PATENT DOCUMENTS

| | | | |
|---|---|---|---|
| 4,286,236 | A | 8/1981 | Fischer |
| 4,322,778 | A | 3/1982 | Barbour et al. |
| 4,534,602 | A | 8/1985 | Bley |
| 4,771,294 | A | 9/1988 | Wasilousky |
| 5,008,678 | A | 4/1991 | Herman |
| 5,138,436 | A | 8/1992 | Koepf |
| 5,194,823 | A | 3/1993 | Wendt et al. |
| 5,252,981 | A | 10/1993 | Grein et al. |
| 5,363,075 | A | 11/1994 | Franucchi |
| 5,414,394 | A | 5/1995 | Gamand et al. |
| 5,451,818 | A | 9/1995 | Chan et al. |
| 5,512,901 | A * | 4/1996 | Chen et al. ............... 342/175 |
| 5,592,178 | A | 1/1997 | Chang et al. |
| 5,680,080 | A | 10/1997 | Nishiyama et al. |
| 5,708,433 | A | 1/1998 | Craven |
| 5,727,023 | A | 3/1998 | Dent |
| 5,760,749 | A | 6/1998 | Minowa et al. |
| 5,912,598 | A | 6/1999 | Stones et al. |
| 6,039,580 | A | 3/2000 | Sciarretta et al. |
| 6,107,956 | A * | 8/2000 | Russell et al. ............... 342/70 |
| 6,137,688 | A * | 10/2000 | Borkar et al. ............... 361/753 |
| 6,167,286 | A | 12/2000 | Ward et al. |
| 6,198,449 | B1 | 3/2001 | Muhlhauser et al. |
| 6,218,987 | B1 | 4/2001 | Derneryd et al. |
| 6,249,242 | B1 | 6/2001 | Sekine et al. |
| 6,265,950 | B1 | 7/2001 | Schmidt et al. |
| 6,324,755 | B1 * | 12/2001 | Borkowski et al. ............ 29/840 |
| 6,463,303 | B1 | 10/2002 | Zhao |
| 6,466,101 | B2 | 10/2002 | Tanji |
| 6,489,927 | B2 | 12/2002 | LeBlanc et al. |
| 6,492,949 | B1 | 12/2002 | Breglia et al. |
| 6,501,415 | B1 | 12/2002 | Viana et al. |
| 6,577,269 | B2 | 6/2003 | Woodington et al. |
| 6,577,879 | B1 | 6/2003 | Hagerman et al. |
| 6,603,915 | B2 | 8/2003 | Glebov et al. |
| 6,614,389 | B2 | 9/2003 | Suzuki et al. |
| 6,642,908 | B2 | 11/2003 | Pleva et al. |
| 6,683,557 | B2 | 1/2004 | Pleva et al. |
| 6,693,557 | B2 | 2/2004 | Arnold et al. |
| 6,738,017 | B2 | 5/2004 | Jacomb-Hood |
| 6,784,838 | B2 | 8/2004 | Howell |
| 6,794,950 | B2 | 9/2004 | du Toit et al. |
| 6,864,699 | B2 | 3/2005 | Sakayori et al. |
| 6,933,900 | B2 | 8/2005 | Kitamori et al. |
| 6,965,816 | B2 * | 11/2005 | Walker ............... 701/16 |
| 6,995,730 | B2 | 2/2006 | Pleva et al. |
| 7,038,608 | B1 | 5/2006 | Gilbert |
| 7,132,905 | B2 | 11/2006 | Sano |
| 7,148,766 | B2 | 12/2006 | Tong et al. |
| 7,183,995 | B2 | 2/2007 | Pleva et al. |
| 7,212,698 | B2 | 5/2007 | Bapst et al. |
| 7,231,881 | B2 * | 6/2007 | Nelson ............... 114/211 |
| 7,248,215 | B2 | 7/2007 | Pleva et al. |
| 7,336,141 | B2 | 2/2008 | Mueller |
| 7,336,219 | B1 | 2/2008 | Lohmeier et al. |
| 7,345,619 | B2 | 3/2008 | Hunt |
| 7,379,018 | B1 | 5/2008 | Lohmeier et al. |
| 7,400,290 | B2 | 7/2008 | Woodington et al. |
| 7,403,153 | B2 | 7/2008 | Kelly, Jr. et al. |
| 7,603,097 | B2 * | 10/2009 | Leblanc et al. ............ 455/300 |
| 7,656,362 | B2 * | 2/2010 | Alberding et al. ........... 343/872 |
| 7,680,464 | B2 * | 3/2010 | Pleva et al. ............... 455/81 |
| 2003/0174479 | A1 | 9/2003 | Shimura et al. |
| 2003/0210179 | A1 | 11/2003 | Dizaji et al. |
| 2004/0027305 | A1 | 2/2004 | Pleva et al. |
| 2004/0119564 | A1 | 6/2004 | Itoh et al. |
| 2004/0164892 | A1 | 8/2004 | Shinoda et al. |
| 2004/0203289 | A1 | 10/2004 | Ice et al. |
| 2004/0208249 | A1 | 10/2004 | Risbo et al. |
| 2006/0125682 | A1 | 6/2006 | Kelly, Jr. et al. |
| 2006/0145778 | A1 | 7/2006 | Pleva et al. |
| 2006/0152406 | A1 | 7/2006 | Leblanc et al. |
| 2007/0120731 | A1 | 5/2007 | Kelly, Jr. et al. |
| 2007/0152870 | A1 | 7/2007 | Woodington |
| 2007/0152872 | A1 | 7/2007 | Woodington |
| 2007/0152874 | A1 | 7/2007 | Woodington |
| 2007/0156799 | A1 | 7/2007 | Gilbert |
| 2008/0001809 | A1 | 1/2008 | Woodington et al. |
| 2008/0018523 | A1 | 1/2008 | Kelly, Jr. et al. |

FOREIGN PATENT DOCUMENTS

| | | |
|---|---|---|
| EP | 1 367 668 A1 | 12/2003 |
| EP | 1 804 075 A2 | 7/2007 |
| GB | 2 292 484 | 2/1996 |
| GB | 2 381 666 A | 5/2003 |
| GB | 2 413 703 B | 3/2007 |
| WO | WO 2004/044610 A1 | 5/2004 |
| WO | WO 2005/093828 A1 | 10/2005 |

OTHER PUBLICATIONS

Response to European Office Action dated Sep. 20, 2010 for Pat. Appl. No. 06 127 324.9.

PCT Search Report of the ISA for PCT/US2007/088063 dated Apr. 28, 2008.

Written Opinion of the ISA for PCT/US2007/088063 dated Apr. 28, 2008.

EP1 804 075 A3 (w/English Abstract and European Search Report), Jan. 21, 2009.

Lohinetong et al.: "Microstrip to Surface Mounted Foam-Based Waveguide Transition for Ka-Band Filter Integration;" 2004 4th International Conference on Microwave and Millimeter Wave Technology Proceedings; IEEE vol. 1; Oct. 11, 2004; ISBN: 978-0-7803-8401-9; pp. 899-902.

Picard et al.; "LTCC Transition and Embedded Bandpass Filter for LMDS Applications;" 2004 Microwave Conference; IEEE vol. 1; Oct. 11, 2004; ISBN: 978-1-58053-992-0; pp. 389-392.

Cheng; "A Fast Hybrid MoM/FEM Technique for Microstripline Vertical Couplers With Multiple Identical Cavities;" IEEE Jun. 2003; 0-7803-7846; pp. 1076-1079.

Gao et al.: "Adaptive Linearization Schemes for Weakly Nonlinear Systems Using Adaptive Linear and Nonlinear FIR Filters;" Dept. of Electrical Engineering, University of Toronto; IEEE; Jan. 1991; CH2819-1/90/0000-0009; pp. 9-12.

Lin et al.; "A High Speed Low-Noise Equalization Technique with Improved Bit Error Rate;" EEE; Jul. 2002; 0-7803-7448; pp. 564-567.

Lohinetong et al.; "Microstrip To Surface Mounted Foam-Based Waveguide Transition For Ka-Band Filter Integration;" IEEE Jun. 2004; 0-7803-8401; pp. 899-902.

Mueller; "SMD-Type 42 GHz Waveguide Filter;" IEEE Jan. 2003; 0-7803-7695; pp. 1089-1092.

Nordsjo; "An Algorithm for Adaptive Predisortion of Certain Time-Varying Nonlinear High-Power Amplifiers;" 2002 The Institution of Electrical Engineers; XP-002364938; pp. 469-473.

EP Search Report and Written Opinion of the European Patent Office for EP 05 11 1991.5; dated Mar. 2, 2006.

EP Search Report and Written Opinion of the European Patent Office for EP 05 11 1994.9 dated Mar. 31, 2006.

EP Report and Written Opinion of the European Patent Office for EP 05 111 983.2 dated Apr. 7, 2006.

PCT Search Report & Written Opinion for PCT/US2006/088063 received on Apr. 28, 2008.

Lohmeier et al.; "Method And System For Generating A Target Alert;" U.S. Appl. No. 11/322,869, filed Dec. 30, 2005.

Woodington, et al.; "Multichannel Processing Of Signals In A Radar System"; U.S. Appl. No. 11/323,458, filed Dec. 30, 2005.

* cited by examiner

# VEHICLE RADAR SENSOR ASSEMBLY

CROSS-REFERENCE TO RELATED APPLICATIONS

This application is a continuation application of U.S. patent application Ser. No. 11/323,816 entitled "Vehicle Radar Sensor Assembly," filed on Dec. 30, 2005; now U.S. Pat. No. 7,603,097 which is a continuation-in-part of U.S. patent application Ser. No. 11/027,523 filed on Dec. 30, 2004 now U.S. Pat. No. 7,680,464.

FIELD OF THE INVENTION

This invention relates generally to housings for radio frequency (RF) systems and more particularly to structures and techniques supporting radar structure and circuits.

BACKGROUND OF THE INVENTION

As is known in the art, in some applications it is necessary to couple radio frequency (RF) signals between multiple printed wiring boards (PWBs). Such connections are often made by using either a coaxial cable or a printed shielded RF conductor circuit (also referred to as a flex circuit). Both of these techniques are troubled by implementation complexity, reliability concerns, as well as cost issues.

A coaxial cable connection typically requires the mounting of a connecting pin on the PWB. The coaxial cable shield is stripped to expose a section of a center conductor which is then soldered to the connecting pin. This is done through a cover assembly, which is typically provided as a two-piece assembly, to provide a required level of isolation between different circuit portions. Although this type of connection results in a relatively high level of performance, it is a relatively complicated assembly requiring precision parts.

A multi-layer flex circuit PWB interconnection can be implemented by soldering a center conductor from a flex-print circuit to a signal path on a PWB. Although this approach has fewer parts, the flex-print circuit is relatively expensive because of the need to include ground planes and via holes to achieve desired isolation levels. Furthermore, it is relatively difficult to obtain a good electrical seal around a flex circuit and this makes it difficult to achieve a desired level of isolation between the PWBs being connected through the flex circuit. More, in high frequency applications, the losses through this type of structure can be relatively high.

SUMMARY OF THE INVENTION

In accordance with the present invention, a radar electronics module includes a support structure having a first surface having a plurality of recesses provided therein. A radio frequency (RF) transmitter circuit board and an RF receiver circuit board are disposed over the first surface of the support structure such that RF circuits on the respective transmitter and receiver circuit boards are disposed in respective ones of the recesses provided in the support structure. The transmitter and receiver circuits are provided having conductive regions provided thereon such that when the transmitter and receiver circuit boards are disposed over the recesses in the support structure, the recesses form electrically sealed cavities. The radar electronics module further includes a digital/power supply circuit printed wiring board (PWB) disposed on a second surface of the support structure opposite the RF transmitter and receiver circuit boards. A connector (also referred to as a header) is disposed on the support structure in such a way that the connector provides electrical connections for at least one of power signals, analog signals or digital signals between at least two of: the digital/power supply PWB, the transmitter circuit board and the receiver circuit board.

With this particular arrangement, a compact radar electronics module appropriate for use as part of a vehicle radar system is provided. The support structure provides a frame for mounting radar transmitter and receiver circuits in close proximity to each other without interfering with each other either physically or electrically. The transmitter circuit board includes a transmitter circuit and a transmit antenna and the receiver circuit board includes a receiver circuit and a receive antenna. The configuration of the support structure allows the transmit and receive antennas (and related transmit and receive circuits) to both be mounted on the same side of the support structure while at the same time physically separating the two antennas without adding additional hardware and cost. The transmitter and receiver circuit boards are provided having certain conductive regions shaped such that when the transmitter and receiver circuit boards are disposed over the support structure (thereby covering recesses in the support structure), the recesses become cavity structures having disposed therein RF circuits and components. The cavity structures serve to isolate transmitter and receiver circuitry existing in close proximity to each other on the transmitter and receiver circuit boards. Disposing the RF circuits and components in metal cavities serves to further electrically isolate the RF circuits and components from each other thereby reducing the amount of undesired RF leakage signals and cross-talk between the RF circuits and components. Placing the RF circuits and components in the cavities also removes the need to apply a conformal coating over the circuit boards and the RF circuits and components which is desirable since conformal coatings typically cause additional attenuation in RF signals propagating in RF circuits and components. Thus, the support structure (including the recesses provided in the support structure) both physically and electrically separates the transmitter and receiver circuit boards as well as electrical circuits on the transmitter and receiver circuit boards. Also, disposing RF circuits and components in metal cavities helps shield and thus protect them from environmental factors (e.g. rain) The support structure also includes as an integral part thereof, at least a portion of a waveguide transmission line which couples RF signals between the transmit and receive circuit boards. In one embodiment, a portion of a support structure has three sides of a rectangular transmission line integrally formed therein. A fourth wall of the waveguide transmission line, is provided by a conductor which can be provided as a printed circuit conductor disposed on either the digital/power supply PWB or the transmitter or receiver circuit boards (depending upon circuit configurations which may be different for different applications). Thus, when the circuit board is disposed over the support structure, the conductor on the circuit board forms the fourth waveguide wall. Also, the surface of the support structure is provided having no holes or openings therein which would allow RF signals to pass from one side of the support structure to the other side once the digital/power supply circuit PWB and transmitter and receiver circuit boards are mounted thereon. Thus, the support structure also acts as an RF shield between the digital/power supply circuit PWB and the transmitter and receiver circuit boards. That is, by mounting the digital/power supply circuit PWB on a side of the support structure opposite the transmitter and receiver circuit boards, the support structure electrically isolates the digital/power supply circuit PWB from RF signals generated by circuitry on the transmitter and receiver circuit boards. Thus, the digital/power supply circuit PWB is isolated from stray RF signals (e.g. leakage and other signals) emanating from the transmitter and receiver circuit boards. The connector provides a means for coupling desired signals between the transmitter circuit board, the receiver circuit board and/or the digital/power supply circuit PWB. Thus, the support structure provides a single integrated structure which physically organizes, and electrically isolates radar electronics disposed on the digital/power supply circuit PWB, and the transmitter and receiver circuit boards. Also, the support structure acts as a heat sink and helps dissipate thermal energy generated by circuits on the digital/power supply circuit PWB and the transmitter and receiver circuit boards. The support structure can be manufactured using relatively low cost materials and low cost manufacturing techniques. Thus, the support structure is a single, low cost, integrated structure which serves multiple functions including but not limited to: physical separation and electrical isolation of transmitter circuits, receiver circuits, digital circuits and power circuits (including isolation between transmit and receive antennas); ease of electrical interconnection between transmitter circuits, receiver circuits, digital circuits and power circuits (including DC power connections and RF signal connections) through a connector and/or an integral waveguide; thermal dissipation of heat generated by electronics on all of the circuit boards mounted thereon; and, importantly, integrates all of the antenna connections (transmit and receive antenna connections) in a single support structure.

In accordance with a further aspect of the present invention, a sensor assembly includes a housing, an electrical shield disposed in the housing and a radar electronics module disposed in the housing over the electrical shield.

With this particular arrangement, a compact sensor assembly which is protected from environmental factors and which is provided from a small number of parts is provided. In a preferred embodiment, the radar electronics module is provided from a support structure having a digital/power supply circuit PWB mounted on one side thereof and transmitter and receiver circuit boards mounted on a second, opposite side thereof. The shield is provided having no openings provided in the bottom surface thereof and is provided having a sized and shape which substantially matches a shape and size of a bottom surface of the housing and a side of the support structure on which the digital/power supply circuit PWB is disposed. Since the shield is a closed surface (i.e. no openings), when it is disposed over the digital/power supply circuit PWB of the radar electronics module, the shield essentially seals one side of the radar electronics module. The transmitter and receiver circuit boards may be provided from a material which can withstand environmental conditions and are provided having transmitter and receiver electronic components disposed only on one side thereof. The transmitter and receiver circuit boards are mounted to the support structure in such a way that any transmitter and receiver electronic components are disposed in closed cavities formed on the support structure by mounting the transmitter and receiver circuit boards on the support structure. Thus, once the transmitter and receiver circuit boards are mounted to one side of the support structure (e.g. using conductive epoxy) and the shield is disposed over the second side of the support structure (i.e. over the digital/power supply circuit PWB) the radar electronics module corresponds to a substantially sealed unit which is disposed in the housing. In one embodiment, the housing is provided as an open box with the transmit and receive antennas facing the open side of the housing. A radome can be disposed over the open portion of housing and coupled to the housing any one a variety of different techniques including but not limited to laser welding the radome to the housing. In this case, the sensor assembly is provided having a so-called box-within-a-box packaging structure. That is, the radar electronics module with the shield disposed over one side thereof forms a first closed box and the housing having the radome coupled thereto forms a second closed box. By placing the radar electronics module/shield (i.e. the first box) inside the housing/radome assembly (i.e. the second box) the sensor assembly is provided having a box-within-a-box packaging structure. In this manner, the circuit components are shielded (i.e. protected) from the environment by two sets of barriers or walls. The first set of walls being provided by the combination of the radar electronics module and shield (i.e. the first box) and the second set of walls being provided by the housing/radome assembly (i.e. the second box). The first set of walls which protect the RF circuit components correspond to the walls of the cavities formed by the arranging the transmitter and receiver circuit boards over the recesses in the support structure. The first set of walls which protect the circuit components on the digital/power supply circuit PWB correspond to the walls provided by the shield disposed over the digital/power supply circuit PWB.

BRIEF DESCRIPTION OF THE DRAWINGS

The foregoing features of this invention, as well as the invention itself, may be more fully understood from the following description of the drawings in which.

DETAILED DESCRIPTION

Figure 1:
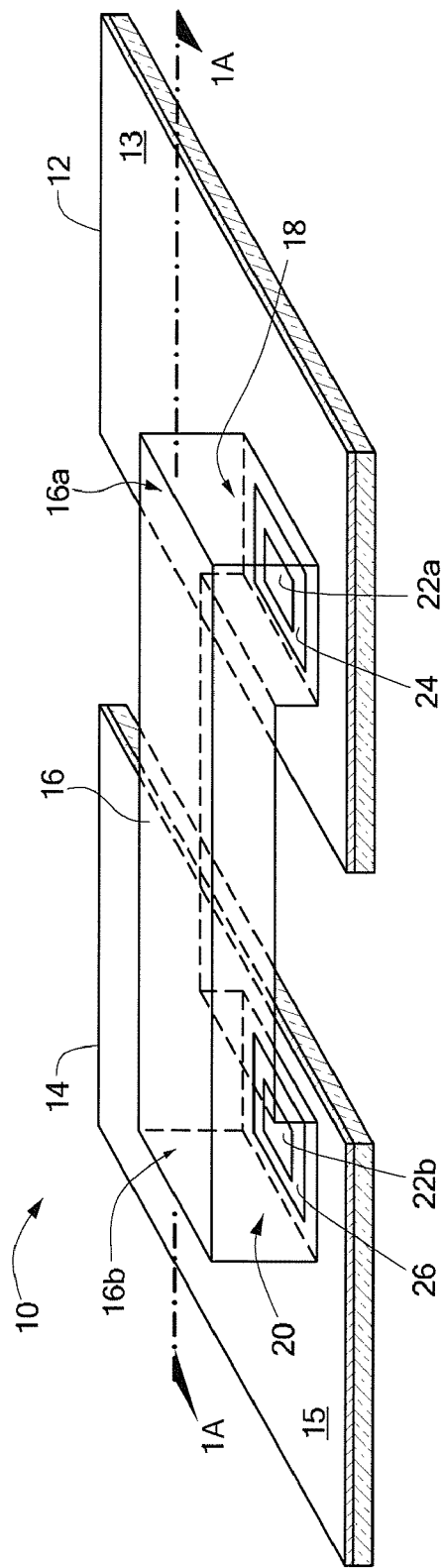
FIG. 1 is an isometric view of two printed wiring boards (PWBs) having a waveguide radio frequency (RF) interconnect therebetween.
Figure 1A:
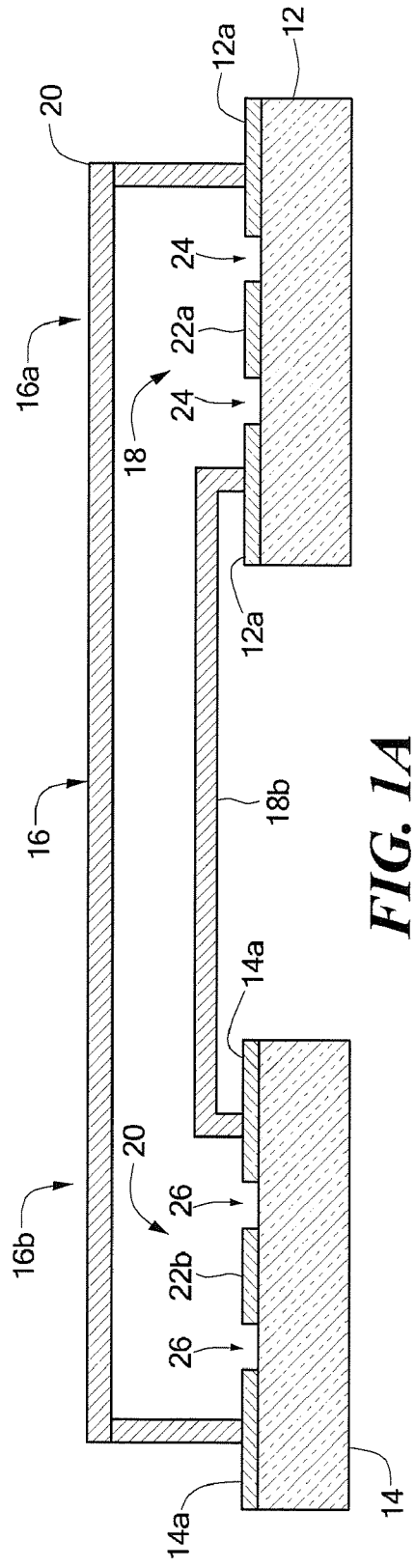
FIG. 1A is a cross-sectional view of a the RF interconnect shown in FIG. 1 taken across lines 1A-1A in FIG. 1.

Referring now to FIGS. 1 and 1A in which like elements are provided having like reference designations, an RF interconnection 10 between first and second radio frequency (RF) Printed Wiring Boards (PWBs) 12, 14 (also sometimes referred to as printed circuit boards or PCBs) includes a waveguide transmission line 16 having first and second ends 16a, 16b (also referred to as waveguide port apertures or more simply waveguide ports) and pair of waveguide feed circuits 18, 20 disposed to launch signals into and couple signals out of the transmission line 16 at ends 16a, 16b, respectively.

The feed circuits 18, 20 are each provided as an integral part of at least a portion of the PWBs 12, 14 respectively. In the exemplary embodiment shown in FIGS. 1 and 1A, the feed circuits 18, 20 are provided as radiating elements and in particular are provided as micro-strip (or so-called "patch") antenna elements on PWB surfaces 12a, 14a. Each patch is provided from a conductive region 22a, 22b separated from PWB ground planes 13, 15 by dielectric regions 24, 26.

Each end 16a, 16b of the waveguide 16 must be conductively attached to the ground planes 13, 15 of the respective PWBs 12, 14. The waveguide 16 can be attached to the PWBs via a conductive epoxy, via a solder connection, via a pressure contact or by any other means now or later known to those of ordinary skill in the art.

By using a waveguide section for the transmission line and incorporating the waveguide feeds into each PWB, an RF interconnect between two PWBs which is reliable and cost-effective is provided. Since the waveguide feeds 18, 20 are incorporated into each PWB, separate connecting structures are not needed on each of the PWB's and the RF interconnect is provided having fewer parts than other RF interconnect techniques. Moreover, as will become evident from the description provided hereinbelow, since the waveguide 16 can be constructed in many different ways, the waveguide could easily be incorporated into a PWB support structure or package, essentially reducing the part count of the RF interconnect to zero.

The particular size, shape, transmission and other characteristics of the waveguide will depend upon a variety of factors including but not limited to the frequency of operation and the type of PWB's being connected. For example, the size of the waveguide opening could be different for each PWB due to differences in dielectric constants of the PWB materials; the waveguide may be filled with dielectric to reduce the size for lower frequency operation or and the waveguide can be provided as so-called ridged waveguide for use in relatively broad band applications.

Likewise, the particular type of feed to use in any application will depend upon a variety of factors including but not limited to the PWB type and construction as well as the frequency band in which the feed must operate and the bandwidth requirements. While the exemplary embodiment, of FIGS. 1 and 1A illustrate the feed structure as a microstrip antenna element, in other embodiments, it may be desirable or necessary to provide the feed structure as a stacked patch antenna element (e.g. if an application requires a relatively wide frequency bandwidth). A stacked patch can be provided, for example, by incorporating the stacked patch feed in the PWB design or by adding into the waveguide a foam insert having a parasitic patch on one side thereof and arranging the insert above a patch on the PWB (such as patch 22a) to provide a stacked patch structure.

It should be appreciated that any radiator design may be used as a feed for the waveguide structure. The feed (particularly when provided as a printed circuit radiator) may be provided having any desired shape including but not limited to a rectangular shape, a square shape, an oval shape, a round shape, a cross shape a polygonal shape or even an irregular shape. The particular type and shape of the feed will be selected in accordance the needs of the particular application and in accordance with a variety of factors including but not limited to the type of transmission line being used, the size and shape of the transmission line and the amount of space available on the PWB for the feed.

Figure 2:
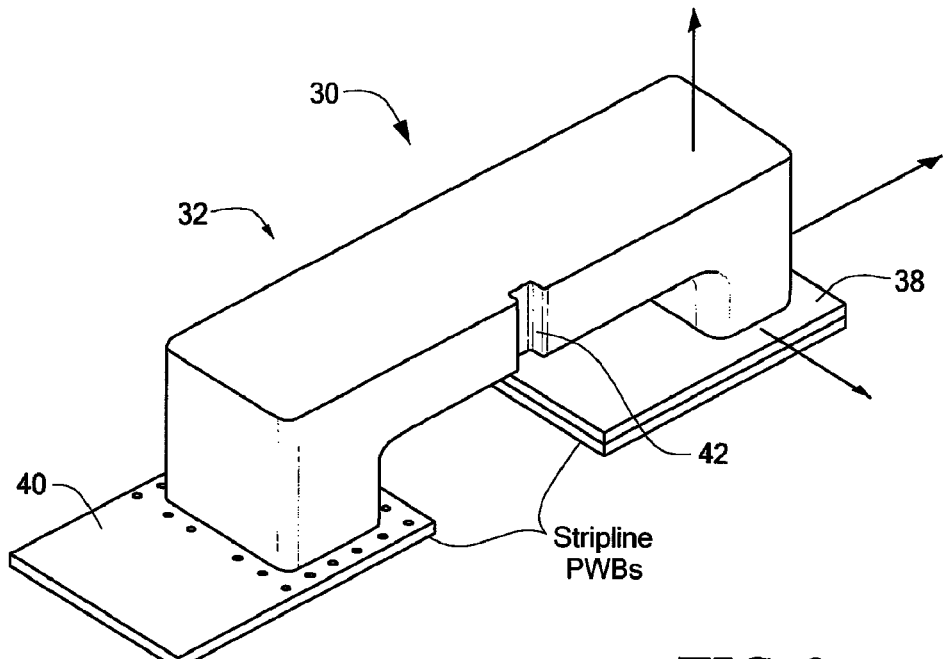
FIG. 2 is an isometric view of a waveguide RF interconnect having a tuning structure.
Figure 2A:
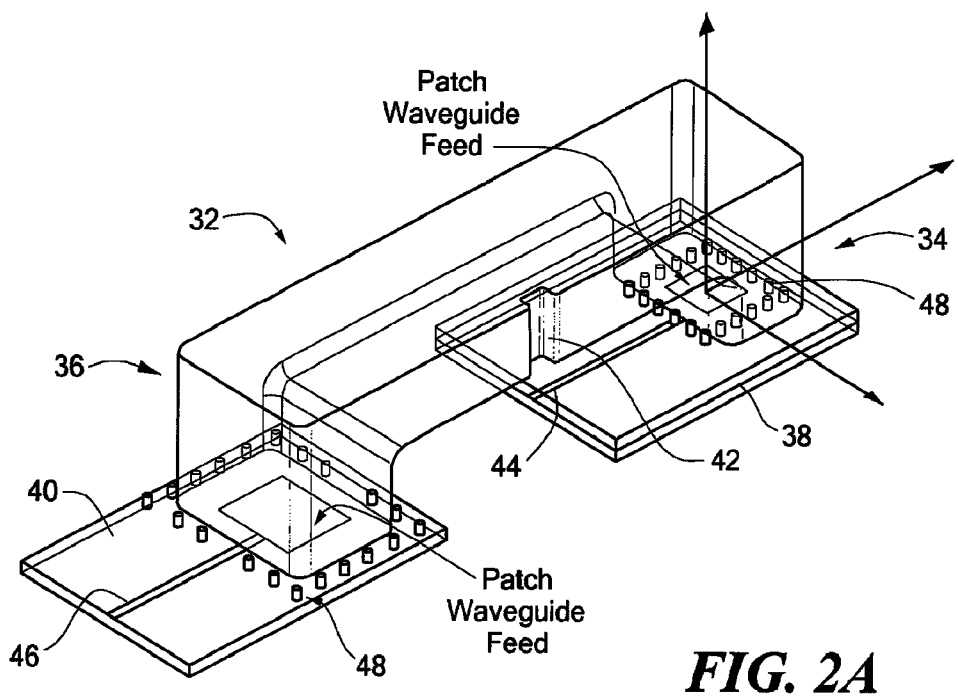
FIG. 2A is an isometric view of the waveguide RF interconnect of FIG. 2 with the waveguide shown in phantom.

Referring now to FIGS. 2 and 2A in which like elements are provided having like reference designations, an RF interconnection 30 includes a waveguide transmission line portion 32 (or more simply a "waveguide 32") and associated feed structures 34, 36 (visible in FIG. 2A) through which RF signals are coupled between a pair of PWBs 38, 40 (only portions of the PWBs 38, 40 being shown in FIGS. 2 and 2A for clarity). The waveguide transmission line portion 32 and associated feed structures 34, 36 (FIG. 2A) may be similar to the RF interconnection and associated feed structures described above in conjunction with FIGS. 1 and 1A.

The waveguide is provided having a tuning structure 42 disposed in a wall thereof. The tuning structure 42 is selected having a size and shape which improves the impedance match between the waveguide ports and the feed structures. In the exemplary embodiment of FIG. 2, the tuning structure 42 is provided as a notch 42 in a sidewall of the waveguide 32. The particular size, shape and location of the notch can be determined using empirical techniques to provide a desired impedance match between the waveguide 32 and the feed structures 34, 36 on the PWBs 38, 40.

It should be appreciated that the PWBs 38, 40 may be provided from different materials. For example, PWBs 38, 40 may be provided from materials having different electrical properties such as relative dielectric constants, and also having different structural characteristics such as board thicknesses. In one embodiment, one PWB is provided from a so-called soft substrate material (e.g. polytetrafluoroethylene (PTFE)/woven glass or combinations thereof) having a relative dielectric constant of about 3.02 while the other PWB is provided from a so-called thick film substrate (e.g. low temperature co-fired ceramic—LTCC) having a relative dielectric constant of about 7.4.

This difference in PWB characteristics results in a different waveguide opening for each PWB which results in an inherent mismatch within the waveguide. Thus, to compensate for this mismatch between the openings, the waveguide is provided having a tuning structure 42.

Although the tuning structure 42 is here shown as a single protrusion or post in a single waveguide wall, other types of tuning structures may also be used to "tune" or provide a desired impedance match between the waveguide and one or both of the feed structures. For example, multiple posts, openings, broadwall curtains, narrow wall curtains, steps or any combination thereof may be provided in one or more internal surfaces of the waveguide walls. Alternatively, conductive elements (e.g. probes) or dielectric elements may be inserted into the waveguide. Alternatively still, one or more tuning elements may be provided as part of the PWBs 38, 40 (e.g. tuning circuits may be printed, etched or otherwise provided on one or both of the PWBs. It should also be appreciated that more than one tuning structure may be used. For example, separate tuning structures may be provided on the waveguide to match each waveguide port to the field structure.

Thus, it should be appreciated that the RF interconnect can be modified to accommodate any type or combination of PWB interconnection and any such modifications are considered to be within the scope of what is covered by the claims.

Referring now to FIG. 2A, the waveguide is shown in phantom to reveal the feed structures 34, 36. As can be seen, the feed structures are each provided as integral portions of the PWBs' 38, 40 and in particular, the feed structures are provided as patch radiators disposed in the waveguide apertures. The patch radiators couple signals to and from the waveguide through the apertures.

Strip transmission lines 44, 46 couple RF signals between the patch radiators and other circuits (since only a portion of each of the PWBs 38, 40 are shown in FIG. 2A, no other circuits are visible in FIG. 2A). A plurality of via holes generally denoted 48 are disposed about each of the patch radiators to provide a cavity for the patch and a barrier to any leakage signals from the feed structures 34, 36.

It should be appreciated that the waveguide structures described above in conjunction with FIGS. 1-2A are stand alone structures and are separate from the PCBs themselves. The feed circuits (e.g. feed circuits 22a, 22b in FIGS. 1 and 1A), however are provided as integral parts of the PCBs.

Figure 3:
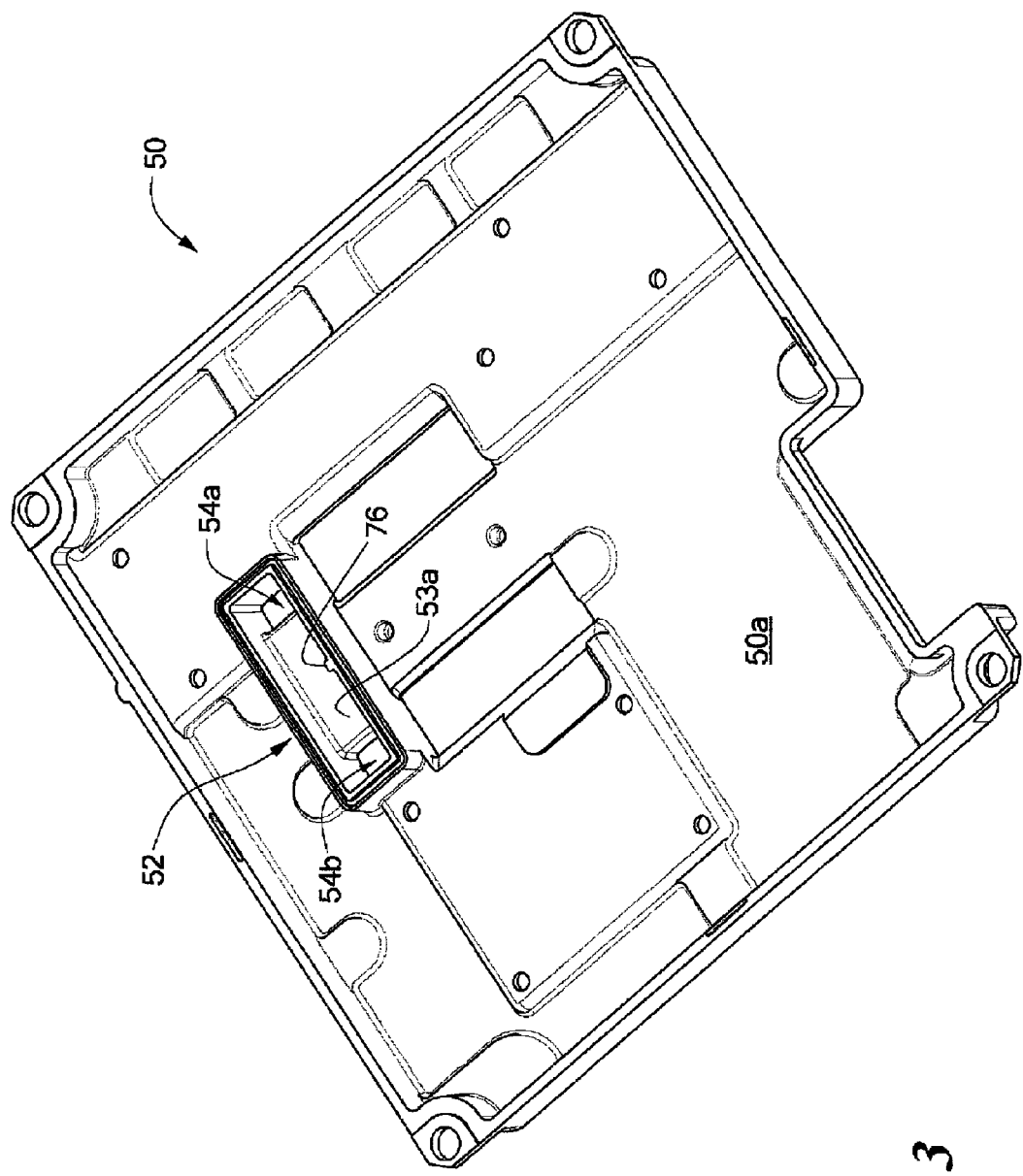
FIG. 3 is an isometric top view of a PWB support frame having an integral waveguide.
Figure 3A:
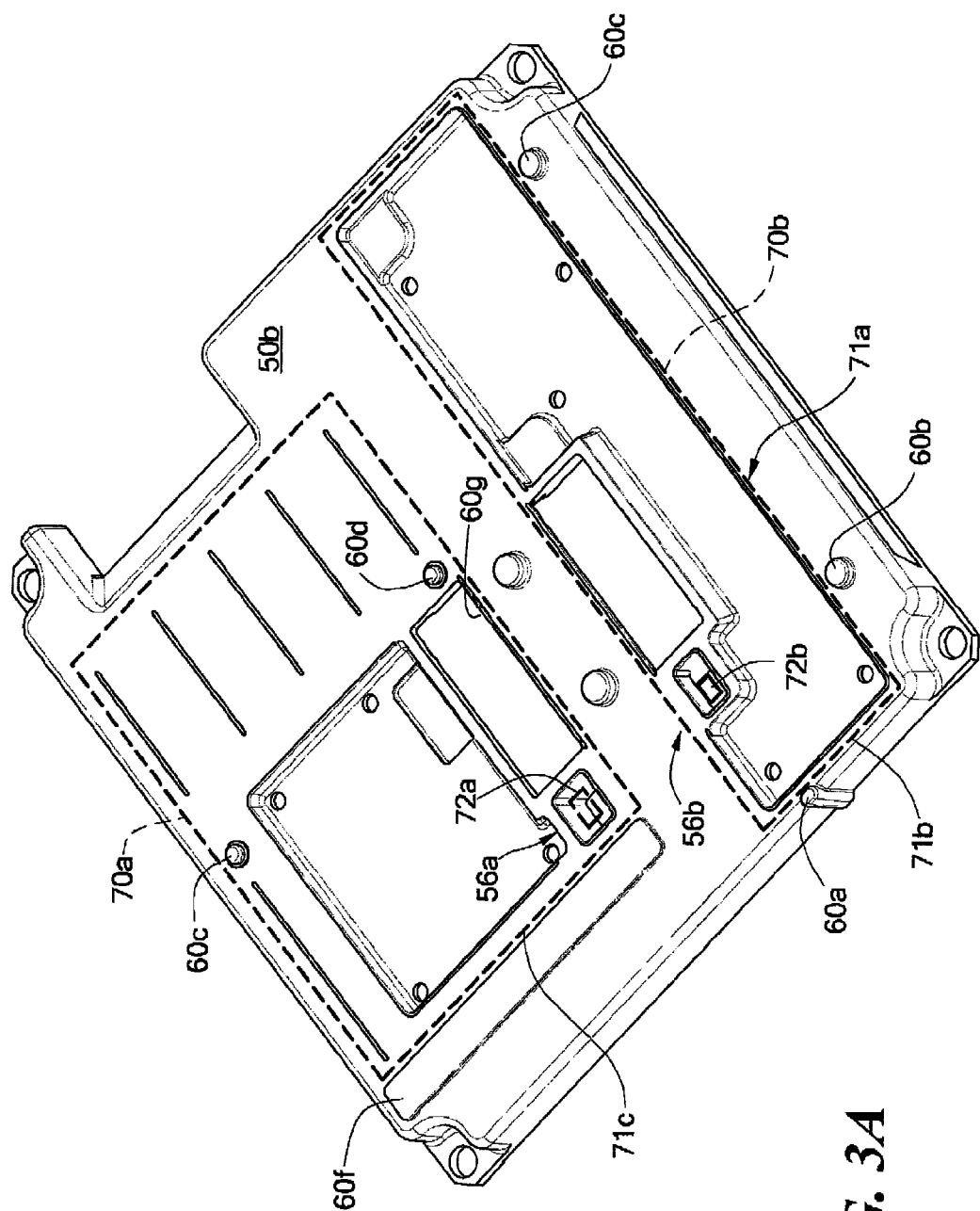
FIG. 3A is an isometric bottom view of the PWB support frame shown in FIG. 3.
Figure 3B:
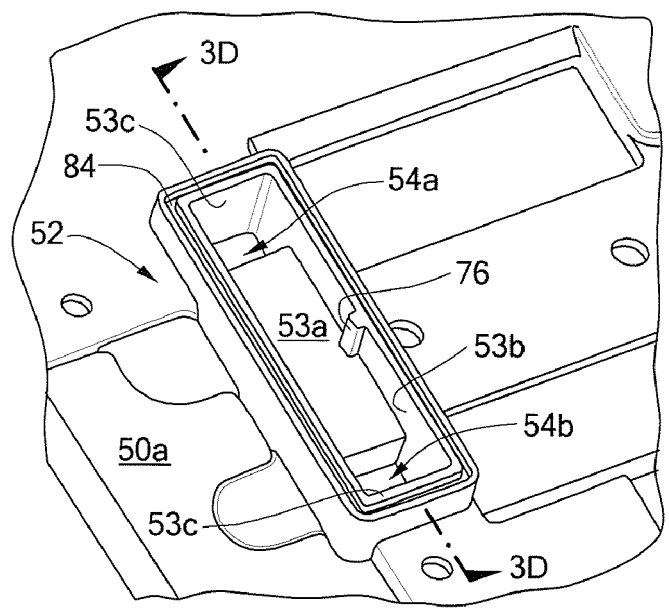
FIG. 3B is an enlarged view of the integral waveguide shown in FIG. 3.
Figure 3C:
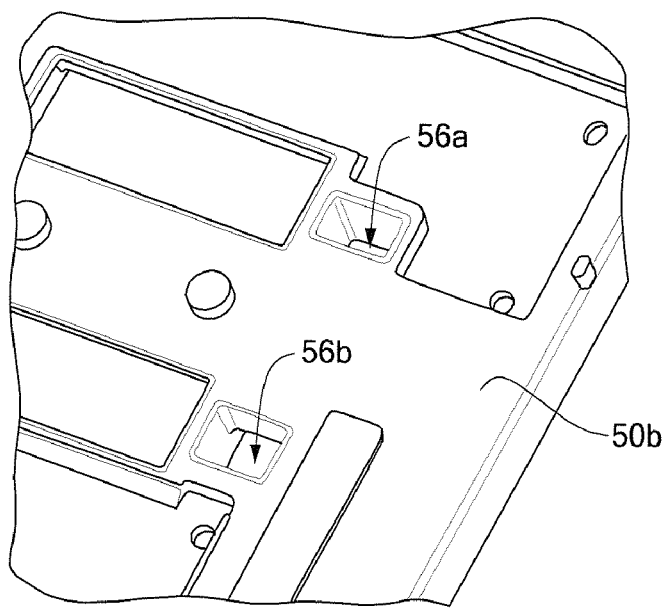
FIG. 3C is an enlarged view of the waveguide opening apertures shown in FIG. 3A.
Figure 3D:
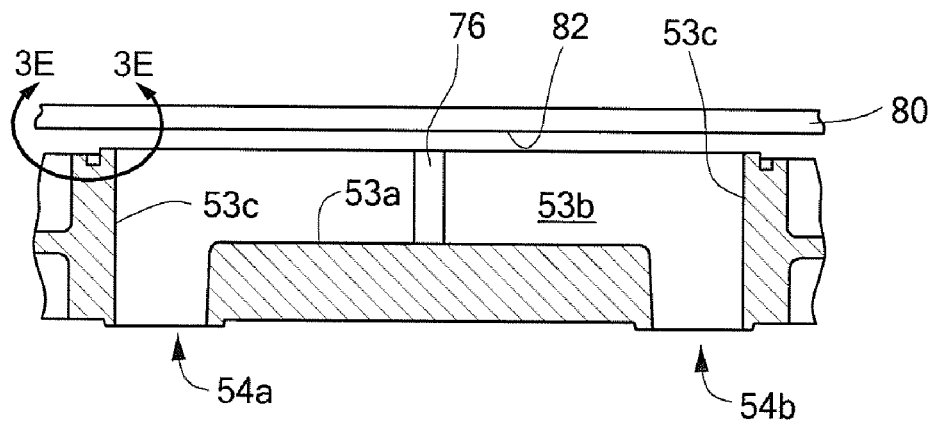
FIG. 3D is a cross-sectional view of the integral waveguide on the PWB support frame taken across lines 3D-3D of FIG. 3B.
Figure 3E:
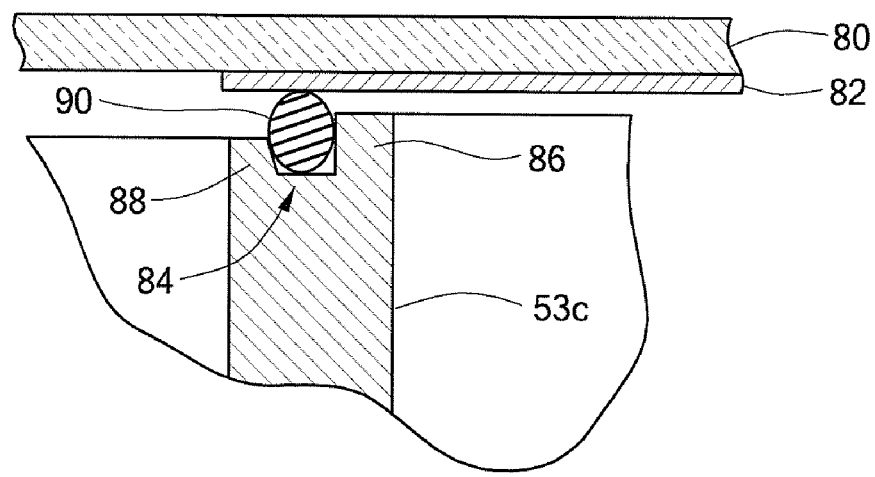
FIG. 3E is an enlarged view of a portion of the waveguide taken across lines 3E-3E of FIG. 3D.

Referring now to FIGS. 3-3E, in which like elements are provided having like reference designations throughout the several views, a PWB frame 50 adapted to hold one or more PWBs is provided having first and second opposing sides 50a, 50b (FIG. 3A). Wall regions 52 project from a surface of side 50a and form a bottom wall 53a (FIG. 3B), sidewalls 53b (FIG. 3B), endwalls 53c (FIG. 3B) and first and second openings 54a, 54b which lead to waveguide port apertures 56a, 56b (FIG. 3C) of a waveguide 53. It should be appreciated that the waveguide 53 is not fully formed in the frame 50 as one side of the waveguide (in this case an E-plane wall opposite wall 53a) is not formed as part of the waveguide structure in the frame 50 as doing so would complicate the frame fabrication process. The waveguide wall could, however, be provided as a separate piece part (e.g. a cover or plate) which is coupled to the remaining waveguide portions by bonding, press-in, solder, welding, or any other technique well known to those of ordinary skill in the art.

As can be most clearly seen in FIG. 3C, the first and second waveguide port apertures 56a, 56b of the waveguide portion 53 of the frame are exposed on a surface of a second side 50b of the PWB frame 50 at first and second ends of the waveguide portion 52.

The frame 50 may be provided from any suitable material including but not limited to metal, plastic, or any other material suitable to support PWB's disposed on the frame. In the case where the frame is provided from a nonconductive material, those portions of the frame corresponding the internal waveguide walls must be coated or otherwise provided with a conductive layer or material.

The frame 50 can be fabricated using molding or any other fabrication techniques known to those of ordinary skill in the art and with which the waveguide 53 can be provided as an integral part of the frame 50. That is, ideally, the waveguide 53 is provided in the frame without the use of additional parts or additional assembly steps.

It should be appreciated that in this particular embodiment, the waveguide openings 54a, 54b and apertures 56a, 56b are neither the same size nor the same shape. Although the openings 54a, 54b may be the same shape in some embodiments, in general, the size and shape of each waveguide opening 54a, 54b and aperture 56a, 56b is selected to provide a suitable impedance match between the waveguide 53 and the respective feed circuits.

Two PWBs 70a, 70b shown in phantom in FIG. 3A, are disposed on side 50b of the PWB frame 50. The PWBs are provided having feed circuits 72a, 72b (also shown in phantom in FIG. 3A) disposed on surfaces of the PWBs and located such that when the PWBs 70a, 70b are properly located on side 50b of PWB 50, the feed circuits 72a, 72b are aligned with the waveguide openings 54a, 54b to couple signals between the PWBs 70a, 70b and the waveguide ports 54a, 54b. It should be appreciated that any type of alignment or locating structure may be used to ensure that the PWBs 70a, 70b are properly aligned in the frame 50.

As shown in FIG. 3A, in this exemplary embodiment, a plurality of alignment posts 60a-60e and alignment surfaces 60f, 60g project from a surface of side 50b and are used to ensure proper alignment of the PWBs 70a, 70b on the PWB frame 50. In particular, sides 71a, 71b of PWB 70b are in contact with alignment posts 60a-60c. In this manner, feed circuit 72b is properly aligned in the aperture 56a A pair of tooling holes 60d, 60e and surfaces 60f, 60g are used to align PWB 70a in the PWB frame to thus ensure that feed circuit 72a is properly aligned in the aperture 56b. In particular, holes in the PWB 70a are aligned with the holes 60d, 60e and posts enter both the PWB holes and the PWB frame holes 60d, 60e to align the PWB 70a on the PWB frame. The posts may project from the holes 60d, 60e or the PWB holes may be aligned with the holes 60d, 60e and the posts put in place to maintain the alignment. It should be appreciated, of course, that other features could be added to the waveguide openings and PWBs to provide alignment. In general any alignment technique known to those of ordinary skill in the art can be used to align the waveguide feed with the waveguide opening.

The waveguide 53 is provided having a tuning structure 76 (FIG. 3B) formed as a part of the waveguide wall 53b. In this particular embodiment, the tuning structure is provided as a post or protrusion which can be molded or otherwise provided as part of the sidewall 53b during a process for molding or otherwise providing the waveguide.

As shown in FIG. 3A, the waveguide is provided as an integral part of the PWB frame 50 and the feed structures 72a, 72b are provided as an integral part of the PWBs 70a, 70b. Thus, the entire waveguide-PWB interconnection is provided without the use of additional parts. That is, no parts separate from the frame 50 or PWBs 70a, 70b are required to provide the waveguide-PWB interconnection.

Referring now to FIG. 3D, an expanded cross-sectional view of the integrated waveguide portion 53 of the PWB frame taken across lines 3D-3D in FIG. 3B is shown. When the waveguide is molded as part of the PWB frame, the bottom wall 53a, two sidewalls 53b and two end walls 53c are formed. The top wall (i.e. the wall directly opposite the bottom wall 53a) of the waveguide, however, is not formed since forming the top wall would complicate the mold process. Rather, the top of the waveguide is left open and a top must be placed over the walls 53b, 53c to close the waveguide and thus make it a functional waveguide transmission line.

To that end, a PWB 80 having a conductive region 82 provided thereon is disposed over the open portion of the waveguide 53 and the conductive region 82 forms the fourth side of the waveguide 53. Other conductive tops not provided as part of a PWB may also be used to form the final waveguide wall.

Referring now to FIG. 3E, an expanded cross-sectional view of a portion of the integrated waveguide structure taken across lines 3D-3D in FIG. 3D is shown. A channel 84 is formed in the waveguide wall. An inner wall portion 86 is provided having a height which is greater than an outer wall portion 88. A material 90 is disposed in the channel 80 to secure the conductive region 82 and/or provide a conductive seal between the conductive region 82 and the waveguide sidewalls 53b and endwalls 53c. The material 90 may be provided, for example, as a conductive epoxy 90. Other materials, including but not limited to conductive gaskets, conductive silicones, and crushable wire mesh may, of course, also be used. Alternatively still, the top wall of the waveguide may be provided having a knife-edge shape and a waveguide cover made of a material softer than the edge can be pressed or otherwise forced onto the knife edge of the waveguide wall.

It should be appreciated that in FIG. 3E, a space (or gap) is shown between the conductive region 82 and a top surface of the wall 86. This space is provided only for clarity in describing the drawings and to illustrate the shape of the conductive epoxy 90 shortly before the conductive region 82 is placed tightly against the top surface of the wall 86. In practice, no gap will exist between conductive surface 82 and the top surface of the waveguide wall 86 against which the surface of the conductive region 82 is disposed.

The material 90 is placed in the channel 84 and when the conductive portion of the cover is disposed over the waveguide, the cover pushes against and compresses the material 90. Since the inner wall 86 of the channel wall 84 is higher than the outer wall 88 of the channel wall 84, any excess material flows to the outside of the waveguide rather than toward the inside of the waveguide.

It should be appreciated that the waveguide portion can be constructed in many different ways. For example, it may be possible to form the integral waveguide 53 in the frame 50 such that a side wall of the waveguide (i.e. an H-plane wall in the waveguide) is omitted rather than an E-plane wall. Alternatively, it may be desirable to form the integral waveguide such that a split occurs down the center of an E-plane wall of the waveguide. This may be desirable since the concentration of electrical currents in that waveguide location are relatively weak (this assumes, of course, a waveguide having a rectangular cross-sectional shape and signals propagating within the waveguide in the dominant TE waveguide mode). If other waveguide shapes or modes are used, then it may be preferable to split the waveguide in a different location based upon ease of manufacture and electrical performance characteristics. After reading the description provided herein, one of ordinary skill in the art will understand how to select a waveguide configuration for a particular application while incorporating the waveguide into the PWB or into the PWB support package (i.e. PWB frame) in a manner which eliminates the number of additional parts needed to provide PWB interconnect (i.e. no additional parts needed to provide the interconnect structure).

Figure 4:
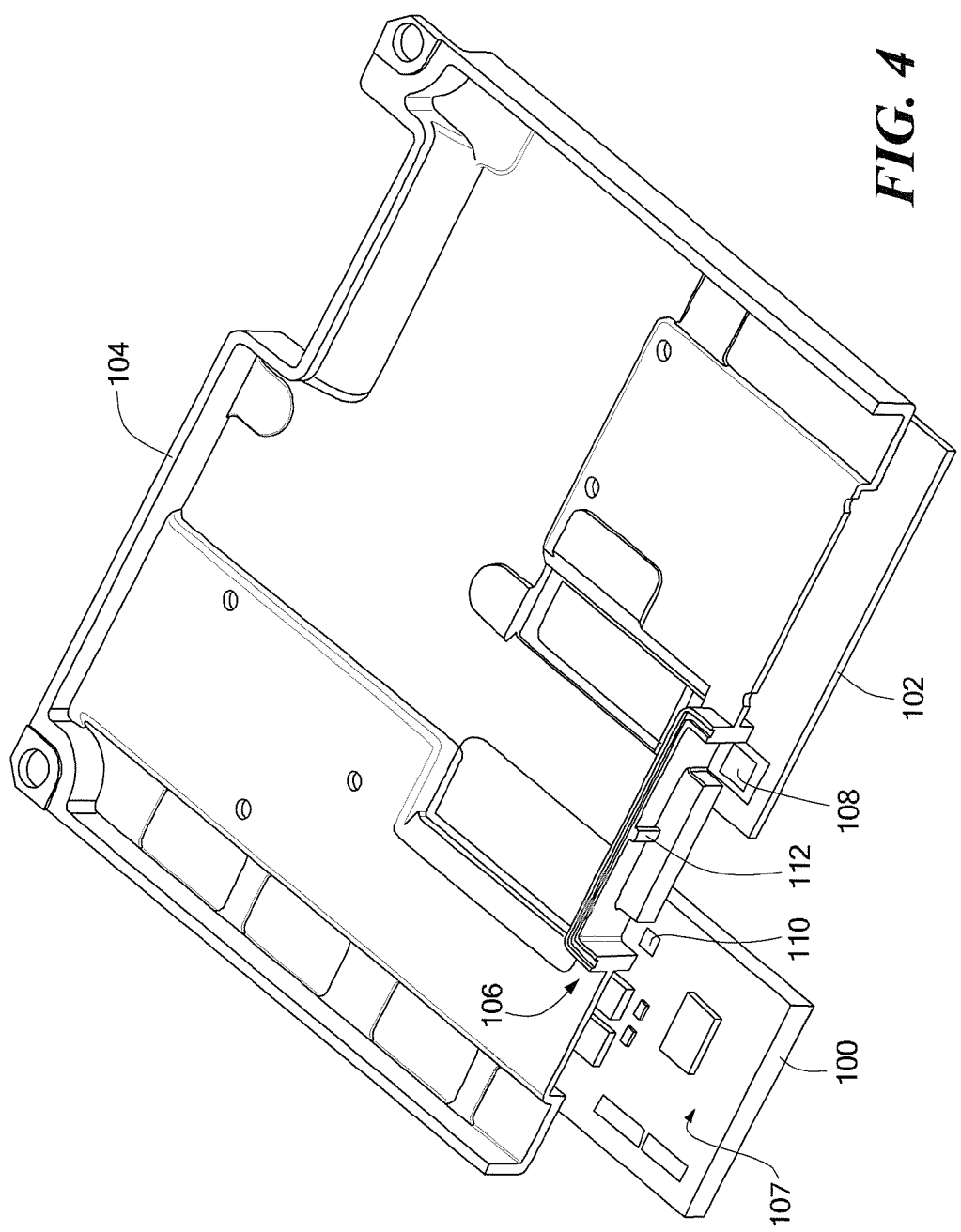
FIG. 4 is an isometric view of two RF PWBs mounted to a PWB support frame.

Referring now to FIG. 4, a pair of PWBs 100, 102 are disposed in a PWB frame 104. The PWB frame 104 has provided as an integral part thereof a waveguide structure 106 which forms a portion of an RF interconnection through which RF signals can be coupled between the two RF PWB boards 100, 102. It should be appreciated that to provide clarity in the drawings and the written description, only portions of the PWBs 100, 102, frame 104 and waveguide 106 are shown in FIG. 4.

A plurality of electrical components generally denoted 107 are disposed on the PWB 100. Each of the PWBs 100, 102 is provided having patch waveguide feeds 108, 110. The feeds 108, 100 provide the excitation for the waveguide structure at each PWB interface (i.e. where the waveguide apertures abut surfaces of the PWBs 100, 102). The patch feed circuits 108, 110 are each provided as printed circuits on the PWBs 100, 102. Thus, the patch feed circuits 108, 110 are each provided as integral parts of the respective PWBs 100, 102.

It should be appreciated that in this exemplary embodiment, the two RF PWBs are of completely different construction. One PWB is provided from a so-called soft substrate material (e.g. polytetrafluoroethylene (PTFE), woven glass or combinations thereof) having a relative dielectric constant of about 3.02 while the other PWB is provided from a so-called thick film substrate (e.g. low temperature co-fired ceramic—LTCC) having a relative dielectric constant of about 7.4.

This difference in PWB characteristics results in a different waveguide opening for each PWB which results in an inherent mismatch within the waveguide. A protrusion 112 in the waveguide wall compensates for this mismatch between the openings. Thus, it should be appreciated that the RF interconnect can be modified to accommodate any type or combination of PWB interconnection and any such modifications are considered to be within the scope of what is covered by the claims.

The RF interconnection is between the two RF PWB's 100, 102. A third PWB (not shown in FIG. 4) includes a printed conductive portion such that when it is disposed on the PWB frame, the conductive portion of the third PWB becomes the cover for the open portion of the waveguide. Thus the waveguide cover can be provided as an integral part of a third PWB. Other types of covers which are not integral with a PWB, may of course, also be used and attached to the waveguide using any one of a variety of techniques including but not limited to bonding, soldering, brazing, welding and press-in techniques.

The two RF PWB boards 100, 102 can be bonded to the support structure 104, using conductive epoxy. Other fastening or attachment techniques may of course also be used. The attachment of the waveguide openings to the PWBs 100, 102 is preferably included as part of the process of bonding the PWBs to the frame.

As explained above, the cover for the waveguide may be provided as a conductive region on a third PWB and in this case, the cover can be attached in a similar fashion when the third PWB is similarly bonded to the frame to complete the assembly. It should be appreciated that the third PWB may be provided as a PWB on which digital circuitry is provided. That is, the third PWB can be provided as a non-RF PWB.

Significantly, the interconnecting waveguide 106 is incorporated into the design of the PWB support structure 104 and is not a separate part. Also, the waveguide cover and the waveguide feeds 108, 110 are all included as integral portions of the circuit layouts for each of three PWB's. Thus, the waveguide-PWB interconnect is provided without using any additional parts. Furthermore, since the waveguide-PWB interconnect assembly process is included as part of the RF module assembly process, no process steps have been added to assemble the waveguide interconnection. Thus, since the waveguide, covers, feeds, and assembly are all included as part of an existing assembly and process, this normally troublesome and costly RF interconnection is realized with nearly no added cost.

Figure 5:
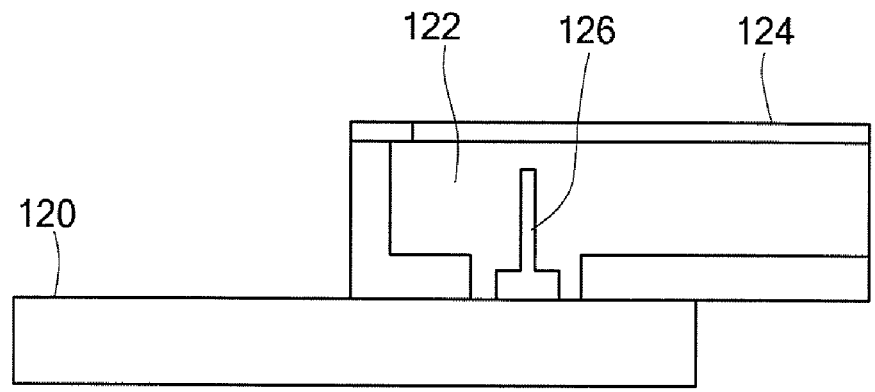
FIG. 5 is a cross-sectional side view of a pin feed for a waveguide RF interconnect coupled to a PWB.

Referring now to FIG. 5, an RF circuit includes a PWB 120 having a waveguide 122 disposed thereon. The waveguide is provided having a cover 124. The waveguide 122 may be provided as an integral portion of a PWB frame. A feed 126 for the waveguide is provided using a launch pin 126. Thus, the structure of FIG. 5 may be similar the structure described above in conjunction with FIGS. 1-4 with the exception being that the feed is provided from a pin 126 rather than as a printed circuit. The advantage to this design is that the feed design has a minimum impact on the PWB design. However, the waveguide will take up more surface area on the PWB in this configuration and there is the added cost of the pin and its assembly on the PWB.

Figure 6:
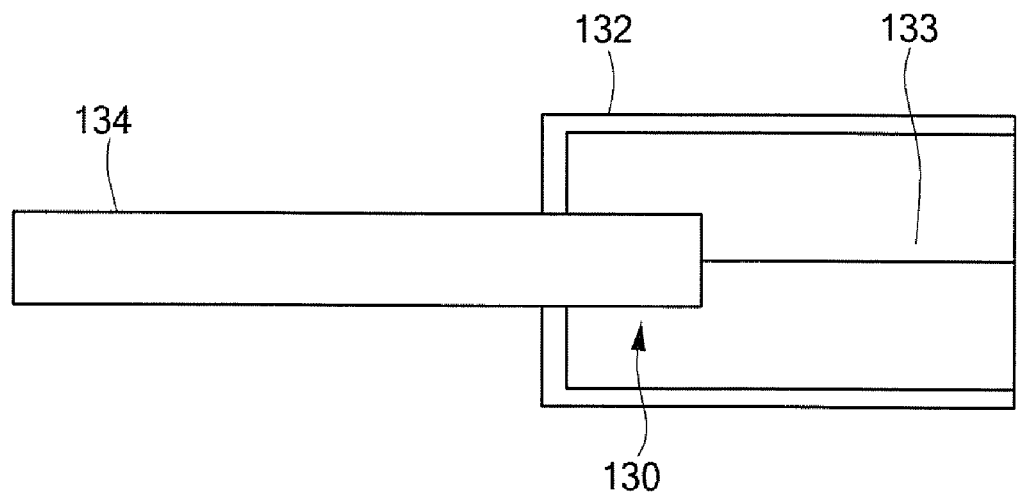
FIG. 6 is a cross-sectional side view of an edge launch waveguide coupled to a PWB.

Referring now to FIG. 6, an alternative waveguide configuration is shown. This configuration has an end launch feed 130 into a waveguide 132 which is split (denoted as 133) along the E-wall (broad dimension) of the waveguide 132. The advantage of splitting the waveguide 132 this way is that it reduces the impact of the seam 133 on waveguide performance. The feed 130 for the waveguide is also incorporated into the design of the PWB 134. However, the design would impact the entire thickness of the PWB 134, whereas the techniques described above only requires the top layers for the feed design. Also, the edge of the PWB 134 becomes a critical dimension since it would be necessary to maintain relatively small tolerances to ensure proper mating with between the waveguide and the feed and it is relatively difficult (and thus expensive) using present state of the art manufacturing techniques to maintain thickness variations of a multi-layer PWB to 10% or less. Moreover, this technique requires at least two parts. One part (e.g. the bottom half waveguide) can be incorporated into the support design as describe previously, but the other part (e.g. the top half waveguide) would need to be a separate part.

Figure 7:
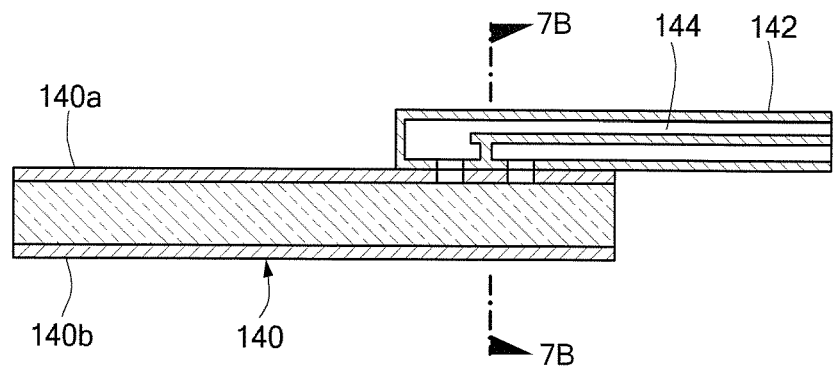
FIG. 7 is a is a cross-sectional side view of a PWB RF interconnect.
Figure 7A:
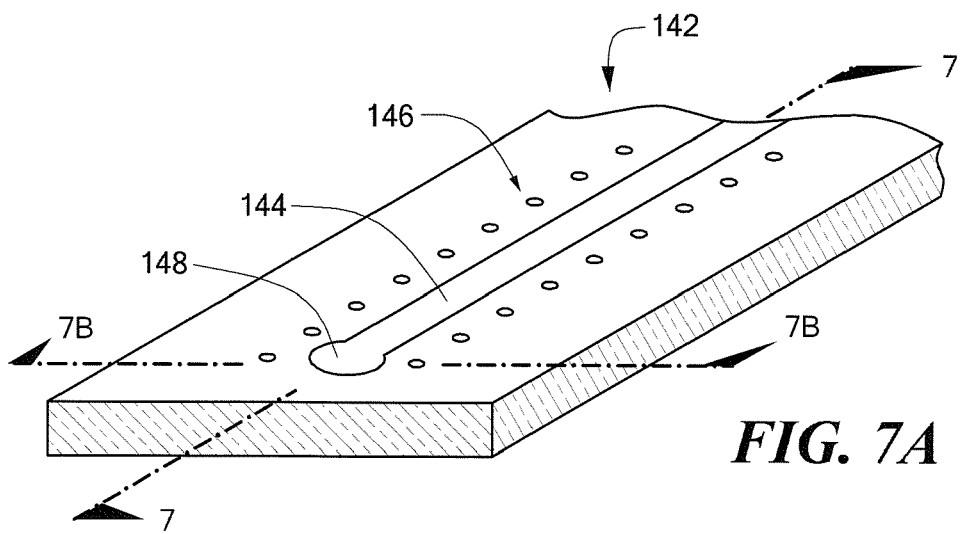
FIG. 7A is an isometric view of a portion of the PWB RF interconnect shown in FIG. 7.
Figure 7B:
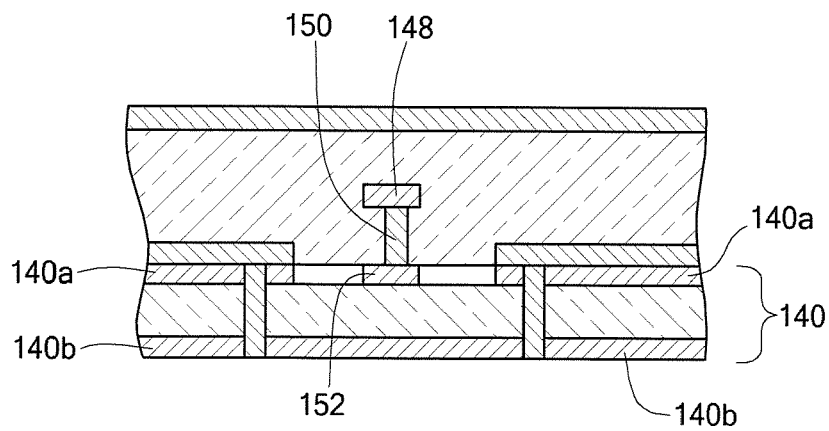
FIG. 7B is a cross-sectional view of a portion of the PWB RF interconnect shown in FIG. 7.

Referring now to FIGS. 7-7B, in which like elements are provided having like reference designations throughout the several views, an RF interconnect is provided by connect a PWB 140 having first and second ground planes 140a, 140b with a coaxial PWB interconnection 142 having a center conductor 144. The center conductor 144 is coupled to a conductor on the PWB 140. A series of plated through holes 146 provides a shield around the conductor 144. An electrical connection 150 is made through a pad 148 on the conductor 144 to a conductor 152 on the PWB 140. In this manner, a RF connection is provided between the PWB 140 and the coaxial PWB interconnection 142. A second PWB (nor visible in FIGS. 7-7B) is coupled to the other end of the coaxial PWB interconnection 142.

This approach has the advantage of simple assembly and the performance of a coaxial connection. The disadvantage is in the significant added cost of the PWB 142.

Referring now to FIGS. 8-11 in which like elements are provided having like reference designations throughout the several views, a sensor assembly 160 includes a housing 162 having a bottom surface 162a and a plurality of side walls 164 which provide the housing having an interior recess region 163 defined by the bottom surface 162a and side walls 164. A shoulder region 166 projects from the bottom surface 162a and the inner surfaces 164a of the sides 164. A connector 168 has a first portion provided on an outside surface 164b of one of the housing side walls 164 and a second portion on an inside portion of the housing sides 164a. Projecting from the inside portion of the housing sidewall 164a is an electrical interface 170 (here shown as a plurality of electrically conductive pins 170). The electrical interface 170 allows electrical connections to be made through the connector 168. The connector 168 provides a structure through which power, ground and CAN signals can be coupled through the side walls 164 to sensor electronics which will be described below.

Disposed in the housing 166 is an electrical shield 172 which has a perimeter region 172a and a bottom surface 172b which does not have any openings (i.e. there are no holes on the "floor" of the shield 172) When the shield 172 is disposed in the housing 164, a surface of the shield perimeter region 172a rests upon the housing shoulder surface 166a to thus support the shield 172 in the housing 164. The shield has one opening 174 through which pins 170 project when the shield 172 is disposed in the housing 164 the shield also has four openings 175a-175d which align with four corresponding mounting holes 171 provided in the corners of the shoulder region 166 of the housing 162 (only one mounting hole 171 being visible in FIG. 8).

A PWB frame 176 (also referred to herein as a "frame" or a "support structure") has first and second opposing surfaces 176a, 176b. The frame 176 is a medium or structure in which the PWBs for antennas and electronics for the sensor 160 are disposed in an organized fashion. The structure 176 additionally provides a means for allowing interconnections for power signals, digital signals (e.g. logic signals), analog signals and RF signals. Significantly, the supports structure also integrates all of the antenna connections (i.e. transmit and receive antenna connections) in a single structure. In preferred embodiments, the frame 176 provides a support structure for all of the electronics associated with the sensor module 160.

The support structure may be provided using a die-cast technique (e.g. to provide the support structure as a die-cast structure). The support structure may also be provided using any other casting or non-casting technique and may be provided from any suitable material. It should be appreciated of course that other techniques, including but not limited to molding or injection molding techniques may also be used. For reasons which will become apparent from the description provided herein below, at least portions of the surface 176b must be conductive. Thus, in the case where the support structure is not provided from an electrically conductive material, at least portions of the support structure must be made conductive (e.g. by plating techniques, deposition techniques or using any other technique well-know to those of ordinary skill in the art).

A digital/power supply printed wiring board (PWB) 180 is coupled to the first surface 176a of the frame 176. Transmitter and receiver circuit boards 182, 184 (also sometimes referred to herein as transmitter and receiver PWBs 182, 184) are disposed on the second surface 176b of the frame 176.

The transmitter and received circuit boards 182, 184 are each provided having an antenna side 182a, 184a, respectively and a component side 182b, 184b respectively. The antenna sides 182a, 184a each correspond to sides of the circuit boards 182, 184 from which antennas (not visible in the FIGs.) provided on the circuit boards transmit and receive RF signals. As will become apparent from the description herein below, the supports structure allows all of the antenna connections (i.e. transmit and receive antenna connections) to be integrated into a single structure. In one embodiment, the transmit and receive antennas may be the same as or similar to the types described in application Ser. No. 11/323,960, filed on even date herewith, inventor Dennis Hunt and entitled "GENERATING EVENT SIGNALS IN A RADAR SYSTEM"; application Ser. No. 11/323,458, filed on even date herewith, inventors Dennis Hunt and W. Gordon Woodington and entitled "MULTICHANNEL PROCESSING OF SIGNALS IN A RADAR SYSTEM" and in application Ser. No. 11/324,035, filed on even date herewith, inventors Dennis Hunt and W. Gordon Woodington and entitled "VEHICLE RADAR SYSTEM HAVING MULTIPLE OPERATING MODES".

A first side 180a of the digital/power supply PWB 180 has digital circuit components disposed thereon while a second side 180b of the PWB 180 (i.e. the power supply side of the PWB 180) has power supply electronics disposed thereon. Thus, the power supply electronics are on the same side of the PWB 180 as the shield 172. In this way, the shield 172 prevents signals generated by the power supply electronics from emanating through the housing 164 and interfering with the remaining electronics of the sensor 160 or other electronic/electrical systems of a vehicle in which the sensor 160 is disposed. The PWB 180 has a region 181 which accepts the pins 170 to thus couple signals between the connector 168 to the radar electronics mounted on the frame 176.

The first or digital circuit side of the PWB 180a has disposed thereon digital circuit components including but not limited to a microprocessor 184, a digital signal processor 186, power control circuitry 188 and a CAN transceiver 190. The PWB 180 also includes an interface (or connect) region 192 adapted to receive an interconnect circuit 194 (also referred to as a connector or a header). In particular, interface region 192 includes a pair of alignment holes 195 having a size and shape adapted to accept alignment pins 199 projecting from the interconnect circuit 194. The interconnect circuit 194 provides electrical signal paths which interconnect circuits (power and digital circuits) on the PWB 180 to circuits on particular portions of the transmitter and receiver circuit boards 182, 184. In the exemplary embodiment shown in FIG. 8, the interconnect circuit 194 is provided as a header 194 and the interconnect region 192 is provided as a plurality of openings 197 in the PWB 180 which are adapted to accept pins 196 projecting from the header 194 (the pins 196 can be most clearly seen in FIG. 10). The pins may be provided having any size and shape as long as the size and shape of the pins 196 and openings 197 in the PWB 180 are selected such that the pins mate with the openings in such a manner so as to form a reliable electrical connection between the pins and the PWB.

The header 194 also includes a pair of alignment structures 198a, 198b which are used to help properly align the header onto the support structure 176. In the exemplary embodiment shown in FIG. 8, the alignment structures 198a, 198b are provided as alignment posts 198a, 198b and the support structure 176 is provided having a corresponding pair of recesses or openings (not visible) which accept the posts 198a, 198b. With the alignment posts disposed in the openings, the header 192 is properly aligned on the support structure 176 and pins 200 projecting from two opposing sides of the header 194 are aligned with openings 202 provided in the support structure 176. The pins 200 are disposed through the support structure openings 202 such that the pins 200 contact electrically conductive regions 204, 206 (FIG. 10) on the transmitter and receiver circuit boards 182, 184, respectively. The conductive regions 204, 206 are also sometimes referred to herein as "contact regions" or "pads."

As mentioned above, the support structure 176 can be provided using a variety of different manufacturing techniques. It should be appreciated that in the case where a molding technique is used to provide the support structure, the connector 194 can be molded as part of the support structure 176. This would eliminate the connector 194 as a separate part. Also, it would be possible to use press-fit technology to couple the connector to one or more of the circuit boards 180, 182, 184 (this press-fit approach can be done regardless of the manufacturing technique used to provide the support structure 176). For example, instead of soldering connector pins 196 to the digital/power supply circuit PWB 180, the connector pins 196 could be press fit into receptacles (e.g. holes) provided in the digital/power supply circuit PWB 180.

The support structure 176 includes a plurality of recess regions 210, 212, 214, 216, 218. The size and shape of each recess region is selected to accommodate a particular circuit on respective ones of the circuit boards 182, 184.

Figure 8:
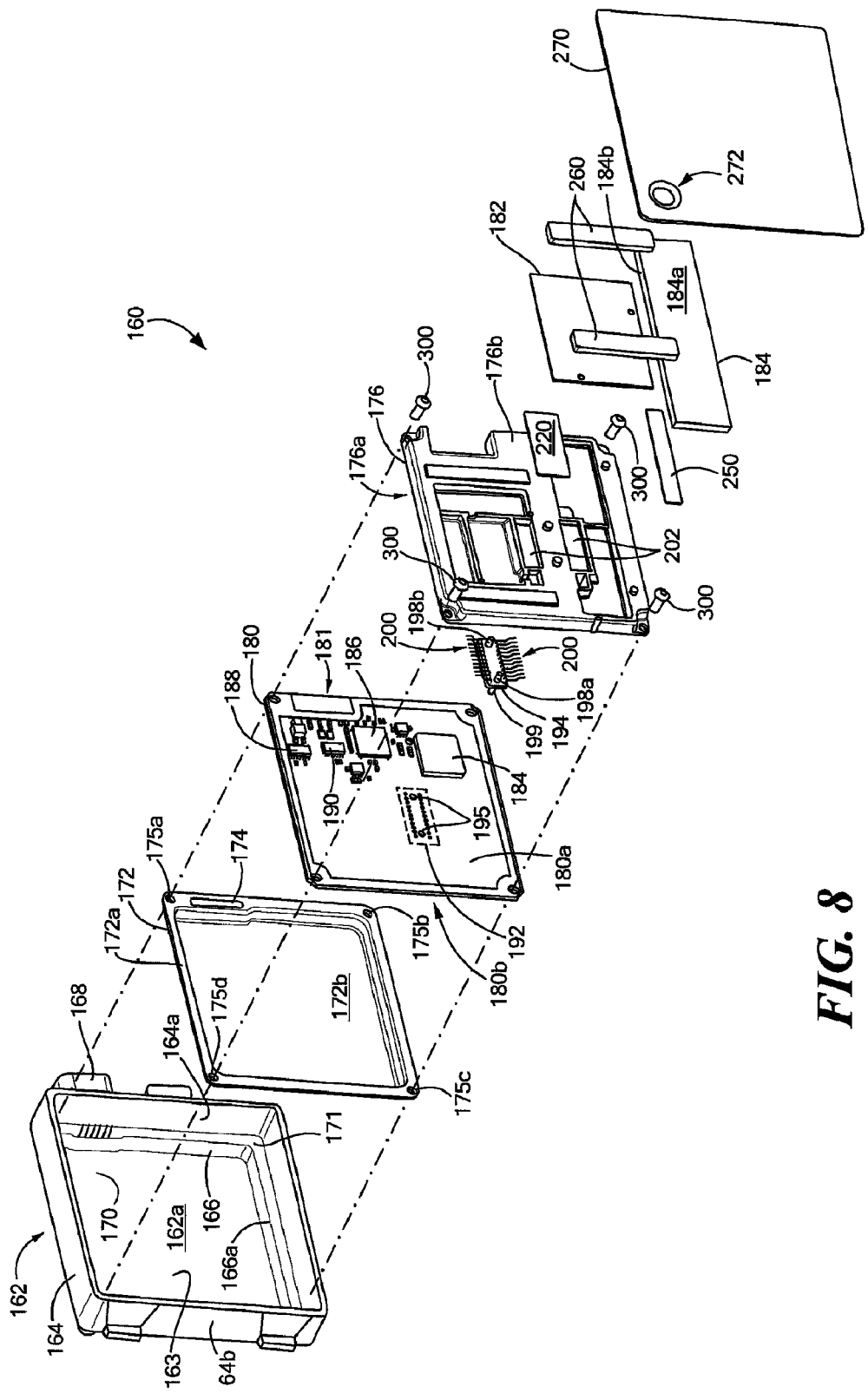
FIG. 8 is an exploded view of a sensor assembly.

Frame 176 is provided having a pair of alignment structures 203a, 203b (FIG. 9) projecting from surface 176b. In the exemplary embodiment of FIGS. 8 and 9, the alignment structures are provided as alignment posts 203a, 203b. The transmitter circuit 182 is provided having a pair of holes 205a, 205b (FIG. 9) which accept the alignment posts when the transmitter circuit board is disposed over the frame 176. The transmitter circuit board, may, for example, be provided as an LTTC circuit board. In the view of FIG. 8, the transmitter circuit components are on the "down" side of the transmitter circuit board 182 (i.e. on the side of the board 182 facing surface 176b of the frame 176). Thus, with the transmitter circuit board 182 disposed over and properly aligned on the frame 176, certain circuitry on the transmitter circuit board 182 is aligned with certain ones of the frame recesses 210, 212, 214.

In particular, a blockage detection circuit (not visible in the FIGs.) provided on the transmitter circuit board 182 is aligned over recess 210, a transmitter circuit (not visible in the FIGs.) provided on the transmitter circuit board 182 is aligned over recess 212 and an antenna element/feed circuit (not visible in the FIGs.) provided on the transmitter circuit board 182 is aligned over recess 214. When the transmitter circuit board 182 is disposed over the frame 176, raised portions or walls 219 of the frame 176 contact conductive portions of the transmitter circuit board 182. That is, the shape of the raised portions 219 of the frame 176 mimics the position of conductive material (e.g. a ground plane) provided on the transmitter circuit board 182. Thus, once the circuit board is disposed on the support structure, the recess regions 210-214 act as cavities in which the respective blockage detection circuit, transmitter circuit and antenna element/feed circuit operate. Arranging circuits in separate cavities (e.g. arranging each of the blockage detection circuit, transmitter circuit and antenna element/feed circuit) in a separate cavity serves to help isolate signals (and in particular, RF signals) on each of the different circuits from each other.

Similarly, the frame 176 is provided having a plurality of alignment structures 230a, 230b, 230c 230d, 230e projecting from frame surface 176b. In the exemplary embodiment of FIGS. 8 and 9, the alignment structures are provided as alignment posts or detents 230a-230e. The receiver circuit board 184 is disposed over the frame 176 such that side 185a contacts post 230a, 230b and that receiver circuit board side 185b contacts post 230c. The receiver circuit board, may, for example, be provided as an LTTC circuit board. In the view of FIG. 8, the received components are on the "down" side of the board 184 (i.e. on the side of the board facing surface 176b of the frame 176). Thus, with the receiver circuit board 184 disposed over and properly aligned on the frame 176, certain circuitry on the down side of the receiver circuit board 184 is aligned with certain ones of the frame recesses 216, 218.

In particular, a receiver and signal generation circuit (not visible in the FIGs.) provided on the receiver circuit board is aligned over recess 216 and an antenna element/feed circuit (not visible in the FIGs.) is aligned over recess 218. When the receiver circuit board 184 is disposed over the frame 176, raised portions (or walls) 232 of the frame contact conductive portions of the receiver circuit board 184. That is, the shape of the raised portions 232 of the frame 176 mimics (i.e. follows the same path as) a conductor provided on the transmitter circuit board 184. Thus, when the circuit board 184 is disposed over the frame, the recess regions act 216, 218 as cavities in which the receiver/signal generation portion of the receiver circuit board and the antenna element/feed circuit of the receiver circuit board are disposed. Arranging circuits in separate cavities (e.g. arranging each of the receiver/signal generation portion of the receiver circuit board and the antenna element/feed circuit) serves to help isolate signals on each of the different circuits from each other. Thus, the combination of the conductors (e.g. ground planes) on the circuit boards 182, 184 and the cavity arrangements help provide good isolation between circuits.

A waveguide transmission line 240 provided as an integral part of the frame 176 has a first port 240a and a second port 240b.

Figure 10:
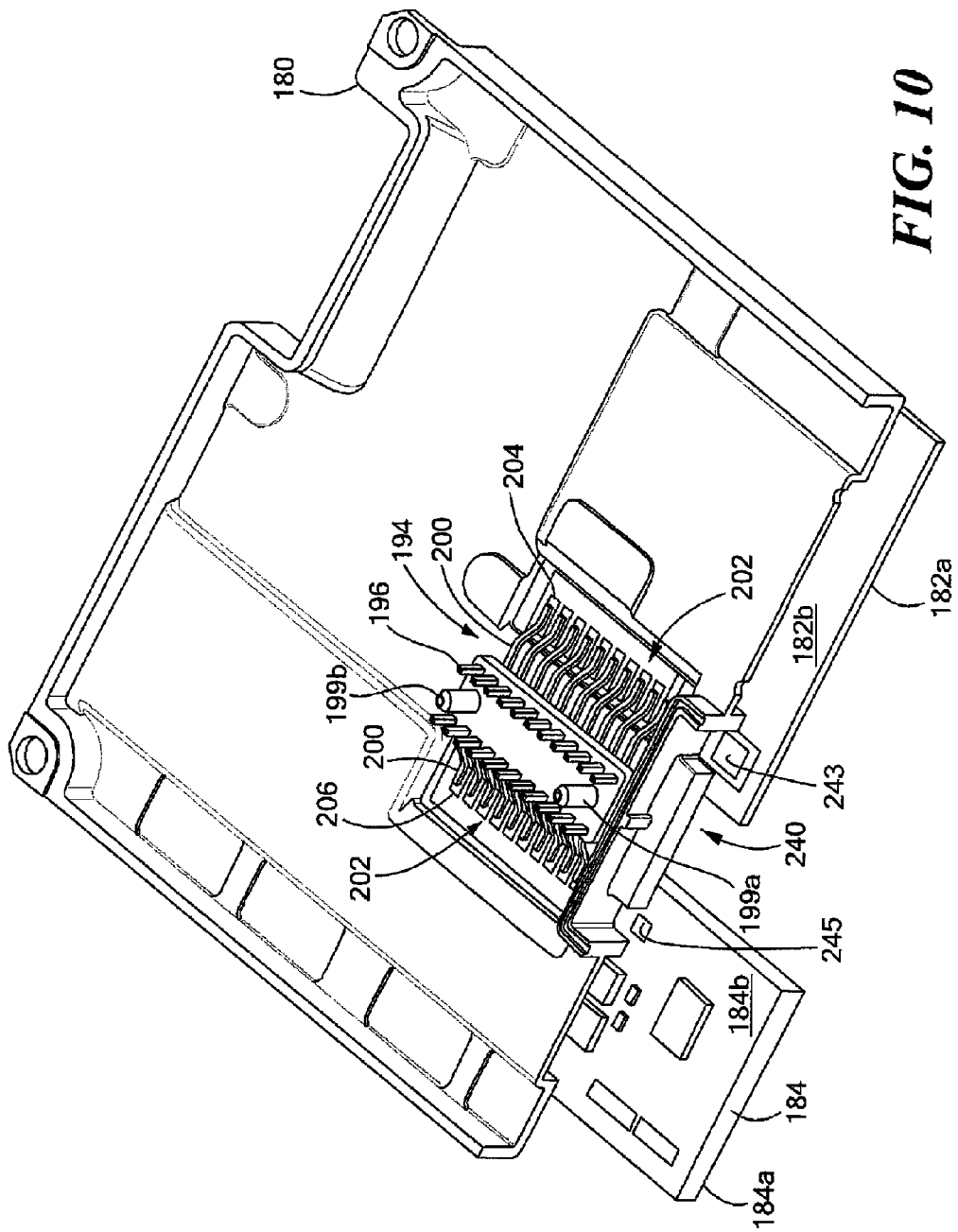
FIG. 10 is an isometric view of a support structure having a connector and transmitter and receiver circuit boards coupled thereto.
Figure 11:
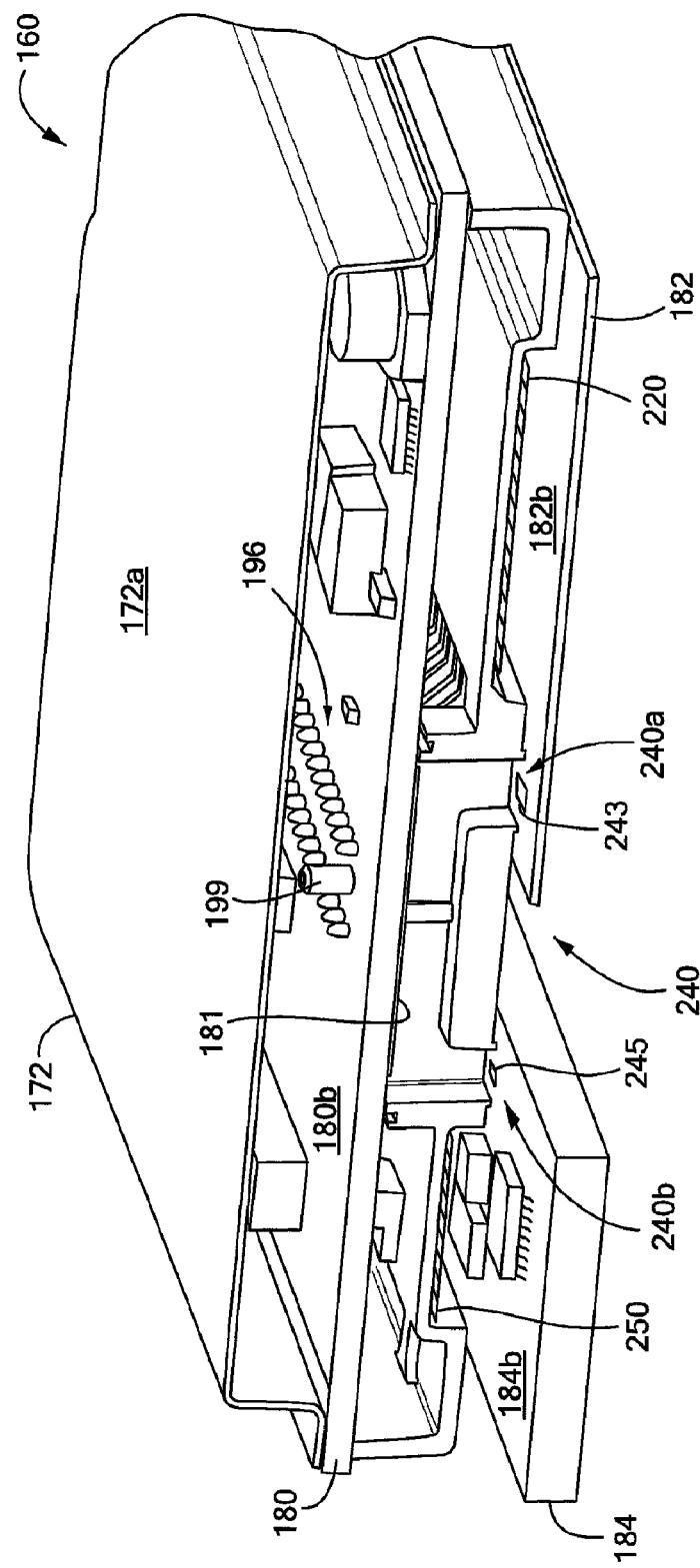
FIG. 11 is an isometric, cut-away view of a portion of a radar electronics module.

Referring briefly to FIGS. 10 and 11, cut away views of the waveguide 240 are visible and it can be clearly seen that the support structure 176 includes as an integral part thereof, at least a portion of the waveguide transmission line 240 which couples RF signals between the transmit and receive circuit boards 182, 184. As shown in the exemplary embodiment of FIGS. 10 and 11, three sides of a rectangular transmission line 240 are integrally formed in the support structure 176. A fourth wall of the waveguide transmission line 240, is provided by a conductor 181 provided on the surface 180a of the digital/power supply PWB 180 (i.e. the digital circuit side of the PWB 180). The conductor 181 may be a conductive material disposed on a the surface 180a of the PWB 180 or it may be a separate piece or material. It should also be appreciated that although conductor 181 is provided on the digital/power supply PWB, in other embodiments a fourth waveguide wall or other waveguide portions not integrally formed in the support structure may be disposed on or provided as part of the transmitter or receiver circuit boards 182, 184 (depending upon circuit configurations which may be different for different applications). Thus, when the PWB 180 is disposed over the support structure 176, the conductor 181 on the PWB 180 forms the fourth wall of the waveguide transmission line 240.

When the transmitter and receiver circuit boards 182, 184 are properly aligned and disposed on the frame 176, the waveguide transmission line 240 has a first port 240a disposed over a first waveguide coupling circuit (or probe) 243 provided on the transmitter circuit board 182 and a second port 240b disposed over a second waveguide coupling circuit (or probe) 245 provided on the receiver circuit board 184. The coupling circuits 243, 245 couple signals from the respective waveguide ports 240a, 240b to circuitry provided on the respective transmitter and receiver circuit boards 182, 184. It should be appreciated that although the coupling circuits 243, 245 are here shown provided as conductors on the component sides of the circuit boards 182b, 184b which form patch elements, other types of waveguide coupling circuits, including but not limited to pin-type probes, could also be used. Thus, the waveguide transmission line 240 provides a signal path through which signals are coupled between the transmitter and receiver circuit boards 182, 184. The waveguide transmission line 240 may be the same as or similar to the type described in conjunction with FIGS. 1-4 above.

It should be understood that the waveguide may be provided having any shape (e.g. circular or any other shape) and that the particular manner in which the waveguide is integrally formed in the support structure and the manner in which signals are coupled to and from the waveguide (e.g. use of pin probes vs. printed circuit probes) is selected to minimize the number of separate components needed to form an operable RF signal path between the transmit and receive circuit boards.

In one embodiment, the transmitter and receiver boards 182, 184 are conductively bonded to the support 176 using a compliant adhesive. The adhesive can be applied in any and/or all locations along which a support structure surface 176b contacts the circuit boards 182, 184.

Referring again to FIGS. 8-11, it should be appreciated that the transmit and receive circuit boards, 182, 184 can be coupled to the frame 176 using any one of a variety of different techniques. In one particular embodiment, a conductive epoxy is disposed on the frame 176 in a pattern which mimics the ground plane on both the transmit and receive printed circuit boards. In one particular embodiment, the conductive epoxy is disposed on walls 219, 232.

Due to constraints on the overall thickness of the sensor assembly, the cavities formed by placing the transmitter circuit board 182 over the frame recesses 210, 212, 214 are not very deep. Thus, prior to placing the transmitter circuit board 182 over the frame 176, an RF absorbing material 220 is disposed in the transmitter circuit cavity 212. The absorber 220 helps to absorb any stray RF signals emitted by the transmitter circuit and thus helps reduce the amount of RF energy which leaks from the transmitter cavity. This is desirable since leakage signals can interfere with or reduce the effectiveness of the operation of other circuit in disposed in the frame 176 (including but not limited to circuits both on and off the transmitter circuit board 182.

Similarly, prior to placing the receiver circuit board over the frame 176, an RF absorbing material 250 is disposed in the receiver circuit cavity 212. The absorber 250 reduces the amount of RF signal which can leak from the receiver cavity 216. This is desirable since the leakage signal can interfere with, or reduce, the effectiveness of the operation of other circuits in disposed in the frame 176 (including but not limited to circuits both on and off the receiver circuit board 184.

The RF absorbing materials 220, 250 are also visible in FIGS. 10 and 11. In one embodiment, the absorbers 220, 250 attached to the cavity walls using a pressure sensitive adhesive.

Once the transmitter circuit board 182 is properly disposed on the frame 176, the exposed surface 182a of the transmitter circuit board 182 is substantially aligned with a top surface of two raised portions 252a, 252b (FIG. 9) which project from the frame surface 176b. Thus, the surface 176b of the support structure corresponding to a top surface of two raised portions 252a, 252b, is provided having a height selected to substantially match the height of the ground plane of the transmit antenna provided on the transmit antenna circuit board 182. By having the frame surface 176b substantially matching the ground plane of the transmit antenna, the ground plane of the transmit antenna is effectively extended. It is desirable to extend the transmit antenna ground plane since this improves the operating characteristics of the transmit antenna.

Ideally, to provide a smooth electrical transition between the ground plane of the transmitter circuit board (i.e. the antenna ground plane) and the ground plane provided by the surface 176b of the support structure 176, no gap should exist between the transmitter circuit board ground plane (i.e. the edge of the transmitter circuit board 182) and the edge of the raised portions 252a, 252b. In practical systems, however, due to required manufacturing tolerances and imperfections, a gap typically does exist in that region. Thus, to further improve the transmit antenna performance, absorber material, 260a, 260b is disposed over the gap between transmitter circuit board 182 and the frame surface 176b.

In particular, the absorber 260a, 260b is disposed such that it covers at least a portion of the transmitter circuit board 182 and at least portions of the raised frame regions 252a, 252b. The absorber 260a, 260b thus covers any space (or gap) between the raised frame regions 252a, 252b and the transmitter circuit board 182. This helps to provide a smooth electrical transition from the substrate ground plane (i.e. the antenna ground plane) to the ground plane provided by the surface 176b of the support structure 176. The absorbers 260a, 260b also thus help to stabilize the side lobe levels on the certain antenna beams.

It should be appreciated that rather than using an absorber material to help provide a smooth electrical transition between the antenna ground plane and the ground plane provided by the surface 176b, a conductive material could also be used. It should be further appreciated that sides of the raised portions 252a, 252b distal from the transmitter circuit board (i.e. sides 253) could be tapered such that a smooth physical transition exists between the top surfaces of the regions 252a, 252b and other lower portions of the surface 176b.

A radome 270 (FIG. 9) provided from a material which is substantially transparent to RF signals transmitted and received by the sensor 160 is disposed over the upper or exposed sides 182a, 184a of the transmitter and received circuit boards. The radome can be attached to the housing any technique well known to those of ordinary skill in the art. In a preferred embodiment, the radome is welded to the housing via a laser welding technique which provides a laser weld joint which connects the radome to the housing.

The radome 270 is provided having a breather vent 272. The breather vent 272 allows moisture vapour to move in and out of the sensor assembly 162. In particular, heat generated by the sensor assembly electronics (typically about 2.5 Watts) drives moisture and moisture vapour (e.g. condensation which may accumulate in the sensor) out of the unit through the breather vent 272. The moisture vent 272 thus helps prevents moisture from saturating the antennas and other electronics provided as part of the transmitter and received circuit boards 182, 184. Its desirable to remove moisture from the sensor assembly since moisture attenuates RF signals in certain frequency ranges. Such attenuation would typically result in degradation in the operating performance of the sensor assembly 160.

Since the cost of manufacturing a unit which can be hermetically sealed is relatively high and thus cost prohibitive to large scale manufacturing of the sensor assembly at a reasonable cost, the idea behind using a moisture vent is to expose the sensor assembly 160 to at lease portions of the environment and to allow heat generated by the sensor assembly to drive out any moisture which may accumulate within the sensor while the sensor is not operating. That is, while the sensor is not operating, moisture (e.g. due to condensation) may accumulate in the sensor. When the sensor is turned on (i.e. the sensor is operating), the unit generates an amount of heat sufficient to drive any accumulated moisture from the sensor. Also, the heat generated by the sensor while the sensor is operating prevents moisture from accumulating inside the sensor assembly 160 during sensor operation.

A breathable vent cover may be disposed over the vent 272 to prevent any dirt or any large particles (including large water particles from entering the unit through the vent.

The vent 172 also prevents "oil canning" of the unit which may otherwise occur due to changes in temperature and/or pressure (e.g. pressure changes due to changes in altitude).

The sensor assembly 160 may be assembled in the following manner. The transmitter circuit board 182 and the receiver circuit board 184 (along with absorbers 220, 250) are attached to the support structure 176. As mentioned above, one technique for attaching the transmitter and receiver circuit boards 182, 184 to the frame is to use conductive epoxy. Next, the header is disposed on the frame 176 and the header pins 200 are electrically connected to corresponding connection points (e.g. conductive pads) on the transmitter and receiver circuit boards 182, 184. Such an electrical connection may be achieved, for example, by soldering the pins 200 to conductive pads. With the header 192 and the transmitter and receiver circuit boards 182, 184 coupled to the frame, the digital/power supply circuit board 180 is disposed on the frame 176 such that the header pins 199 mate with holes and pads provided in the interface region 191 of the digital/power supply circuit board 180. The header pins 196 are electrically coupled to corresponding electrical connection points on the digital/power supply circuit board 180. Such an electrical connection may be achieved, for example, by soldering the pins 196 to the connection points.

Figure 9:
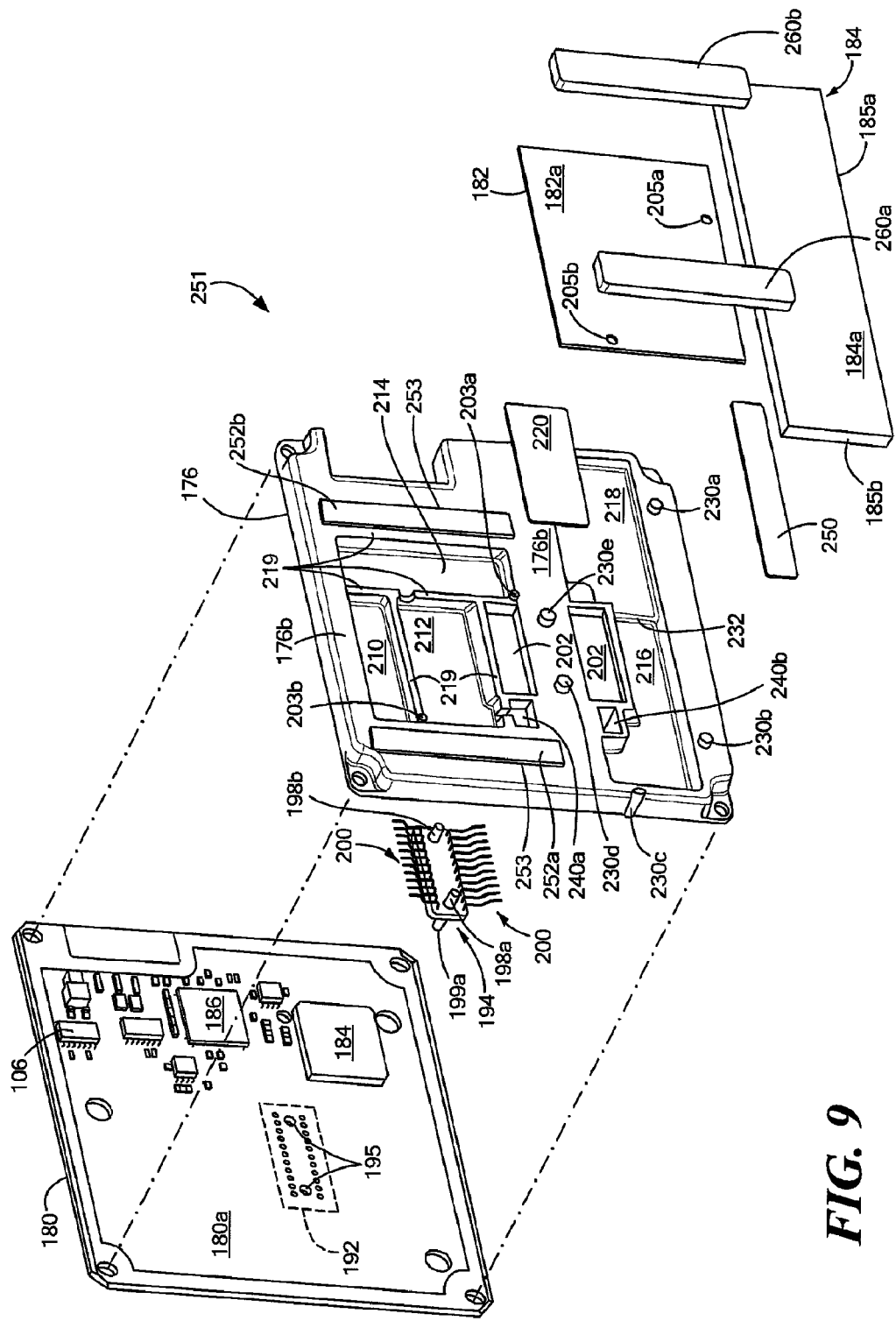
FIG. 9 is an isometric view of a radar electronics module.

Once attached to the support structure 176, the digital/power supply circuit board, the transmitter circuit board 182 and the receiver circuit board 184 along with absorbers 220, 250 (and optionally absorber 260) provide a so-called radar electronics module 251 (FIG. 9). In the case where absorber 260 is used, it is desirable to attach the receiver circuit board 184 to the frame 176 prior to attaching absorber 260 to ensure proper positioning of the absorber 260.

The shield 172 and radar electronics module 251 are then disposed in and secured to the housing 164. As shown in FIG. 8, the shield 172 and radar electronics module are secured to the housing via screws 300 which fasten the shield 172 and radar electronics module to the housing 162 (FIG. 8). It should be appreciated that other fastening techniques may also be used to fasten the shield 172 and radar electronics module 251 to the housing 162. Once the shield and the radar electronics module are secured in the housing 162, the radome 270 is secured to the housing 164. As mentioned above, the radome may be secured to the housing 164 by laser welding the radome to the housing 164.

It should be appreciated that other processes may also be used to assemble the sensor assembly. It should also be appreciated that the circuit boards 180, 182, 184 may be manufactured from any suitable material.

It should also be appreciated that since the base 172b of the shield 172 does not have any openings provided therein and since the transmitter and receiver circuit boards 182, 184 also do not have any openings therein, once the shield 172 covers the radar electronics module 251, a closed box is formed. This closed box is then further enclosed in a second box formed by housing 162 and cover 270. Thus, the sensor 160 is packaged as a box-within-a-box. This box-within-a-box packaging approach further protects the sensor module electronics from environmental conditions.

It should be appreciated that the sensor 160 and circuit boards 180, 182 and 184 may be the same as or similar to the types described in application Ser. No. 11/323,960, filed on even date herewith, inventor Dennis Hunt and entitled "GENERATING EVENT SIGNALS IN A RADAR SYSTEM"; application Ser. No. 11/323,458, filed on even date herewith, inventors Dennis Hunt and W. Gordon Woodington and entitled "MULTICHANNEL PROCESSING OF SIGNALS IN A RADAR SYSTEM" and in application Ser. No. 11/324,035, filed on even date herewith, inventors Dennis Hunt and W. Gordon Woodington and entitled "VEHICLE RADAR SYSTEM HAVING MULTIPLE OPERATING MODES".

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A sensor assembly comprising:
   a housing having a bottom surface and a plurality of side walls which define an interior recess region, said housing having a shoulder region projecting from the bottom surface and the side walls around a perimeter of the interior recess region;

an electrical interface projecting from the a top surface of the shoulder region;

an electrical shield disposed in the recess region of said housing, said electrical shield having a size and shape selected such that when said electrical shield is disposed in the housing, a first surface of a perimeter region of said electrical shield rests upon a top surface of the shoulder region of said housing to support said electrical shield in said housing and a second surface of the perimeter region of said electrical shield is in proximity to a side surface of the shoulder region and wherein said electrical shield is provided having one opening in the surface of the perimeter region through which at least a portion of said electrical interface projects when said electrical shield is disposed in said housing and wherein a bottom surface of said electrical shield does not have any openings provided therein;

a radar electronics module disposed over said electrical shield and electrically coupled to said electrical interface;

a radome disposed over said radar electronics module and coupled to the sidewalls of said housing; and a breather vent disposed in said radome.

2. The sensor assembly of claim 1 wherein said radar electronics module comprises:

a digital/power supply printed wiring board (PWB);

a transmitter circuit having a transmit antenna;

a receiver circuit having a receive antenna;

a PWB frame having first and second opposing surfaces, said PWB frame disposed over said electrical shield within the recess region of said housing, with a first one of said first and second opposing surfaces of said PWB frame configured to hold said digital/power PWB and a second one of said first and second opposing surfaces of said PWB frame configured to hold said transmitter and receiver circuits and said PWB frame also configured to provide interconnections for power signals, digital signals, analog signals and RF signals between said digital/power PWB and said transmitter and receiver circuits.

3. The sensor assembly of claim 2 wherein said PWB frame includes a first plurality of recess regions having a size and shape selected to accommodate particular circuits on said transmitter circuit and said PWB frame includes a second plurality of recess regions having a size and shape selected to accommodate particular circuits on said receiver circuit.

4. The sensor assembly of claim 3 further comprising an RF absorbing material disposed in at least one of the first plurality of recess regions to absorb RF signals emitted by said transmitter circuit.

5. The sensor assembly of claim 2 further comprising an absorber material disposed over a gap between said transmitter circuit and a surface of said PWB frame, said absorber disposed such that it covers at least a portion of said transmitter circuit and at least a portion said PWB frame.

6. The sensor assembly of claim 2 further comprising:

a connector having a first portion provided on an outside surface of one of the housing side walls and a second portion on an inside portion of the housing side walls, said connector electrically coupled to said electrical interface to allow electrical connections to be made through the connector such that the connector provides a structure through which power, ground and car area network (CAN) signals can be coupled through the side walls of said housing to said radar electronics module.

7. The sensor assembly of claim 2 wherein said PWB frame includes a portion of a waveguide which couples of RF signals to the transmit and receive circuits and wherein a surface of said digital/power supply PWB forms a wall of the waveguide.

8. The sensor assembly of claim 1 wherein said breather vent allows moisture vapour to move in and out of the sensor assembly.

9. The sensor assembly of claim 8 wherein said digital/power supply PWB has digital circuit components disposed on a first side thereof and power supply electronics disposed on a second side thereof such that the power supply electronics are on the same side of the PWB as said electrical shield such that said electrical shield prevents signals generated by the power supply electronics from emanating through said housing.

10. The sensor assembly of claim 8 wherein said digital/power supply PWB has a region which accepts said electrically conductive pins to couple signals between said connector and the radar electronics module disposed on said PWB frame.

11. The sensor assembly of claim 10 further comprising:

a blockage detection circuit disposed on the transmitter circuit board and aligned over a first recess;

a transmitter circuit provided on the transmitter circuit board and aligned over a second recess; and an antenna element/feed circuit provided on the transmitter circuit board and aligned over a third recess.

12. The sensor assembly of claim 11 wherein when the transmitter circuit board is disposed over the PWB frame, raised portions or walls of the frame contact conductive portions of the transmitter circuit board.

13. The sensor assembly of claim 12 wherein the shape of the raised portions of said PWB frame mimics a conductor provided on said transmitter circuit such that when said receiver circuit is disposed over said PWB frame, raised portions of said PWB frame contact conductive portions of said receiver circuit and when said transmitter circuit is disposed over said PWB frame, recess regions in said PWB frame as cavities in which the receiver/signal generation portion of the receiver circuit board and the antenna element/feed circuit of the receiver circuit board are disposed and wherein arranging each of the receiver/signal generation portion of the receiver circuit board and the antenna element/feed circuit in separate cavities serves to help isolate signals on each of the different circuits from each other.

14. The sensor assembly of claim 1 wherein said electrical interface is provided as a plurality of electrically conductive pins.

15. A method for assembling a sensor assembly comprising:

(a) attaching a transmitter circuit board, a receiver circuit board, and absorbers to a PWB frame;

(b) disposing a header on the PWB frame and electrically coupling header pins to corresponding connection points on the transmitter and receiver circuit boards;

(c) with the header and the transmitter and receiver circuit boards coupled to the frame, disposing the digital/power supply circuit board on the frame such that the header pins mate with holes and pads provided in an interface region of a digital/power supply circuit board;

(d) electrically coupling header pins to corresponding electrical connection points on the digital/power supply circuit board;

(e) securing a shield and a radar electronics module to a housing;

(f) once the shield and the radar electronics module are secured in the housing, securing a radome to the housing.

16. The method of claim 15 wherein attaching the transmitter and receiver circuit boards to the PWB frame comprises using conductive epoxy.

17. The method of claim 16 wherein electrically coupling header pins to corresponding connection points on the transmitter and receiver circuit boards comprises soldering the pins to conductive pads on the transmitter and receiver circuit boards.

18. The method of claim 17 wherein electrically coupling header pins to corresponding electrical connection points on the digital/power supply circuit board comprises soldering the pins to the connection points.

19. The method of claim 18 wherein securing the shield and radar electronics module to the housing comprises fastening the shield and radar electronics module to the housing via screws.

20. The method of claim 15 wherein securing the radome to the housing comprises welding the radome to said housing.

* * * * *